United States Patent
Inoshima

(10) Patent No.: US 10,096,501 B2
(45) Date of Patent: Oct. 9, 2018

(54) MAINTENANCE METHOD OF SUBSTRATE PROCESSING APPARATUS, METHOD FOR MANUFACTURING SEMICONDUCTOR DEVICE, SUBSTRATE PROCESSING APPARATUS, AND STORAGE MEDIUM CAPABLE OF READING MAINTENANCE PROGRAM OF SUBSTRATE PROCESSING APPARATUS

(71) Applicant: HITACHI KOKUSAI ELECTRIC INC., Tokyo (JP)

(72) Inventor: Kaori Inoshima, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 274 days.

(21) Appl. No.: 14/914,142

(22) PCT Filed: Aug. 27, 2014

(86) PCT No.: PCT/JP2014/072412
§ 371 (c)(1),
(2) Date: Feb. 24, 2016

(87) PCT Pub. No.: WO2015/030047
PCT Pub. Date: Mar. 5, 2015

(65) Prior Publication Data
US 2016/0211157 A1    Jul. 21, 2016

(30) Foreign Application Priority Data

Aug. 27, 2013    (JP) .................................. 2013-175784

(51) Int. Cl.
*G06F 19/00*    (2018.01)
*H01L 21/67*    (2006.01)
(Continued)

(52) U.S. Cl.
CPC .. *H01L 21/67253* (2013.01); *H01L 21/67276* (2013.01); *H01L 21/67745* (2013.01);
(Continued)

(58) Field of Classification Search
CPC ............... H01L 21/67253; H01L 22/26; H01L 21/68757; H01L 21/67757; H01L 21/67745; H01L 21/67276
(Continued)

(56) References Cited

U.S. PATENT DOCUMENTS

2006/0090849 A1* 5/2006 Toyoda ................... C23C 16/54
                                                    156/345.32
2006/0156979 A1* 7/2006 Thakur ............. C23C 16/45546
                                                    118/715
(Continued)

FOREIGN PATENT DOCUMENTS

JP            3854157 B2    9/2006
JP         2008-028206 A    2/2008
(Continued)

*Primary Examiner* — Ziaul Karim
(74) *Attorney, Agent, or Firm* — Volpe and Koenig, P.C.

(57) ABSTRACT

A maintenance method of a substrate processing apparatus includes a first processing step of carrying a first substrate holder holding a substrate into a process chamber and processing the substrate held by the first substrate holder within the process chamber, a second processing step of carrying a second substrate holder holding a substrate into the process chamber and processing the substrate held by the second substrate holder within the process chamber, a determination step of determining a replacement timing of the first substrate holder and the second substrate holder, and a maintenance step of, at the replacement timing determined at the determination step, replacing the first substrate holder and the second substrate holder respectively with a third substrate holder and a fourth substrate holder, if at least one
(Continued)

of the first substrate holder and the second substrate holder reaches the replacement timing.

10 Claims, 18 Drawing Sheets

(51) Int. Cl.
 *H01L 21/677* (2006.01)
 *H01L 21/687* (2006.01)
 *H01L 21/66* (2006.01)
(52) U.S. Cl.
 CPC .. *H01L 21/67757* (2013.01); *H01L 21/68757* (2013.01); *H01L 22/26* (2013.01)
(58) Field of Classification Search
 USPC .......................................................... 700/108
 See application file for complete search history.

(56) References Cited

U.S. PATENT DOCUMENTS

| | | | |
|---|---|---|---|
| 2007/0264840 A1* | 11/2007 | Itatani | C23C 16/4412 438/758 |
| 2009/0081815 A1* | 3/2009 | Yamashita | H01J 37/32091 438/9 |
| 2009/0087964 A1* | 4/2009 | Maeda | C23C 16/345 438/482 |
| 2012/0091097 A1* | 4/2012 | Chen | H01J 37/32926 216/59 |

FOREIGN PATENT DOCUMENTS

| | | |
|---|---|---|
| JP | 2008-078505 A | 4/2008 |
| JP | 4851670 B2 | 10/2011 |
| JP | 2012-134209 A | 7/2012 |

* cited by examiner

FIG. 6

| Job name | JOB-01 |
|---|---|
| Material | Lot ID 01 |
| Number | 50 |
| Boat | Boat A |
| Recipe | ABC |

FIG. 7

| Boat name | Boat A |
|---|---|
| State | Waiting |
| Position | Transfer position |
| Cumulative film thickness value | 100 |

22

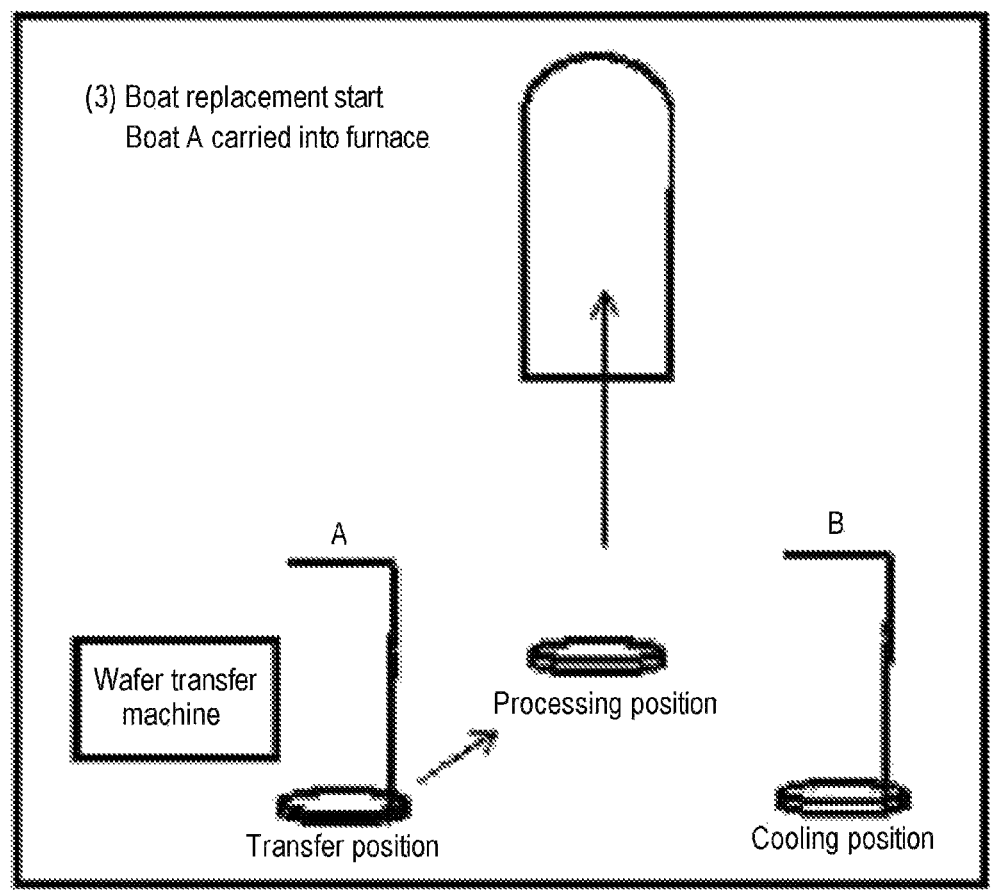

MAINTENANCE METHOD OF SUBSTRATE PROCESSING APPARATUS, METHOD FOR MANUFACTURING SEMICONDUCTOR DEVICE, SUBSTRATE PROCESSING APPARATUS, AND STORAGE MEDIUM CAPABLE OF READING MAINTENANCE PROGRAM OF SUBSTRATE PROCESSING APPARATUS

TECHNICAL FIELD

The present disclosure relates to a substrate processing technique of carrying a substrate holder into a process chamber and processing substrates held by the substrate holder and, more particularly, to a technique of shortening a time period required in the replacement of a substrate holder and improving substrate processing efficiency.

BACKGROUND

In a substrate processing apparatus such as a vertical film forming device or the like, a boat (a substrate holder) holding a plurality (several tens to one hundred and several tens) of substrates is accommodated within a process chamber and is heated while supplying a process gas. By setting the internal pressure and temperature of the process chamber at predetermined values, a film forming process is performed on the surfaces of the substrates by, for example, a CVD (Chemical Vapor Deposition) method.

In this substrate processing apparatus, it is sometimes the case that a two-boat system using two boats is employed in order to improve the operating efficiency of the apparatus. In the two-boat system, while the substrates held on one boat are processed within the process chamber, removal of processed substrates and mounting of unprocessed substrates are performed in the other boat. By doing so, the processing within the process chamber and the mounting and removal of the substrates to and from the boat can be performed in parallel. Thus, in the case of continuously performing the substrate processing, it is possible to improve the substrate processing efficiency. For example, Patent Document 1 listed below discloses a two-boat system in which a boat is designated depending on the individual difference between boats such as an attachment state of an impurity or the like and the content of a recipe and in which substrate processing is performed by carrying the designated boat into the process chamber.

When the substrates mounted to the boat are subjected to a film forming process, films are deposited on the boat as well as the substrates. If the film deposited on the boat has a thickness of a specified value or more, there appears an adverse effect in that the film is peeled off and dropped to become particles. For that reason, if the thickness of the film deposited on the boat reaches a predetermined threshold value, the boat is replaced by a new boat on which a film is not deposited.

In a vertical film forming device, a maintenance worker replaces a boat. Thus, in the case of replacing a boat, it is necessary to stop the device and to take a safety measure such as a measure of cooling the interior of the device and the boat in use. Furthermore, after replacing the boat, it is necessary to perform various kinds of adjustment and an operation check in order to normally operate the device. The works performed before and after the boat replacement are time-consuming. In the case of a vertical film forming device, about six hours are required. Accordingly, as the boat replacement period becomes shorter, the operating rate of the device is lowered and the production efficiency is reduced. Therefore, there is a need to efficiently perform the boat replacement work.

Patent Document 1 listed below discloses a single-substrate processing apparatus provided with a plurality of process chambers. In this apparatus, if the cumulative thickness value of the film deposited on the inner wall of at least one of a plurality of process chambers exceeds a threshold value, cleaning is performed in all the process chambers.

PRIOR ART DOCUMENTS

Patent Documents

Patent Document 1: Japanese Patent No. 4851670
Patent Document 2: Japanese Patent No. 3854157

It is an object of the present disclosure to provide a substrate processing technique capable of efficiently performing a replacement work of a substrate holder.

SUMMARY

According to one aspect of the present disclosure, there is provided a maintenance method of a substrate processing apparatus, including: a first processing step of carrying a first substrate holder holding a substrate into a process chamber and processing the substrate held by the first substrate holder within the process chamber; a second processing step of carrying a second substrate holder holding a substrate into the process chamber and processing the substrate held by the second substrate holder within the process chamber; a determination step of determining a replacement timing of the first substrate holder and the second substrate holder; and a maintenance step of, at the replacement timing determined at the determination step, replacing the first substrate holder and the second substrate holder respectively with a third substrate holder and a fourth substrate holder, if at least one of the first substrate holder and the second substrate holder reaches the replacement timing.

According to another aspect of the present disclosure, there is provided a method for manufacturing a semiconductor device, including: a first processing step of carrying a first substrate holder holding a substrate into a process chamber and processing the substrate held by the first substrate holder within the process chamber; a second processing step of carrying a second substrate holder holding a substrate into the process chamber and processing the substrate held by the second substrate holder within the process chamber; a determination step of determining a replacement timing of the first substrate holder and the second substrate holder; and a maintenance step of, at the replacement timing determined at the determination step, replacing the first substrate holder and the second substrate holder respectively with a third substrate holder and a fourth substrate holder, if at least one of the first substrate holder and the second substrate holder reaches the replacement timing.

According to a further aspect of the present disclosure, there is provided a substrate processing apparatus, including: a process chamber configured to process a substrate; a first substrate holder carried into the process chamber while holding a substrate; a second substrate holder carried into the process chamber while holding a substrate; and a control part configured to determine a replacement timing of the first substrate holder and the second substrate holder and configured to, at the replacement timing thus determined, execute control so as to bring the first substrate holder and the second substrate holder into an empty state in which the first substrate holder and the second substrate holder do not hold a substrate, if at least one of the first substrate holder and the second substrate holder reaches the replacement timing.

According to a still further aspect of the present disclosure, there is provided a storage medium for readably storing a maintenance program of a substrate processing apparatus which causes a computer to execute: a first processing procedure of carrying a first substrate holder holding a substrate into a process chamber and processing the substrate held by the first substrate holder within the process chamber; a second processing procedure of carrying a second substrate holder holding a substrate into the process chamber and processing the substrate held by the second substrate holder within the process chamber; a determination procedure of determining a replacement timing of the first substrate holder and the second substrate holder; and a procedure of, at the replacement timing thus determined, bring the first substrate holder and the second substrate holder into an empty state in which the first substrate holder and the second substrate holder do not hold a substrate, if at least one of the first substrate holder and the second substrate holder reaches the replacement timing.

According to the above configurations, it is possible to prolong a replacement period of a substrate holder.

BRIEF DESCRIPTION OF THE DRAWINGS

FIG. 6 illustrates a configuration example of job information according to an embodiment of the present disclosure.

FIG. 7 illustrates a configuration example of boat information according to an embodiment of the present disclosure.

FIGS. 11A to 11H are views explaining an example of the processing flow according to an embodiment of the present disclosure.

DETAILED DESCRIPTION

Figure 1:
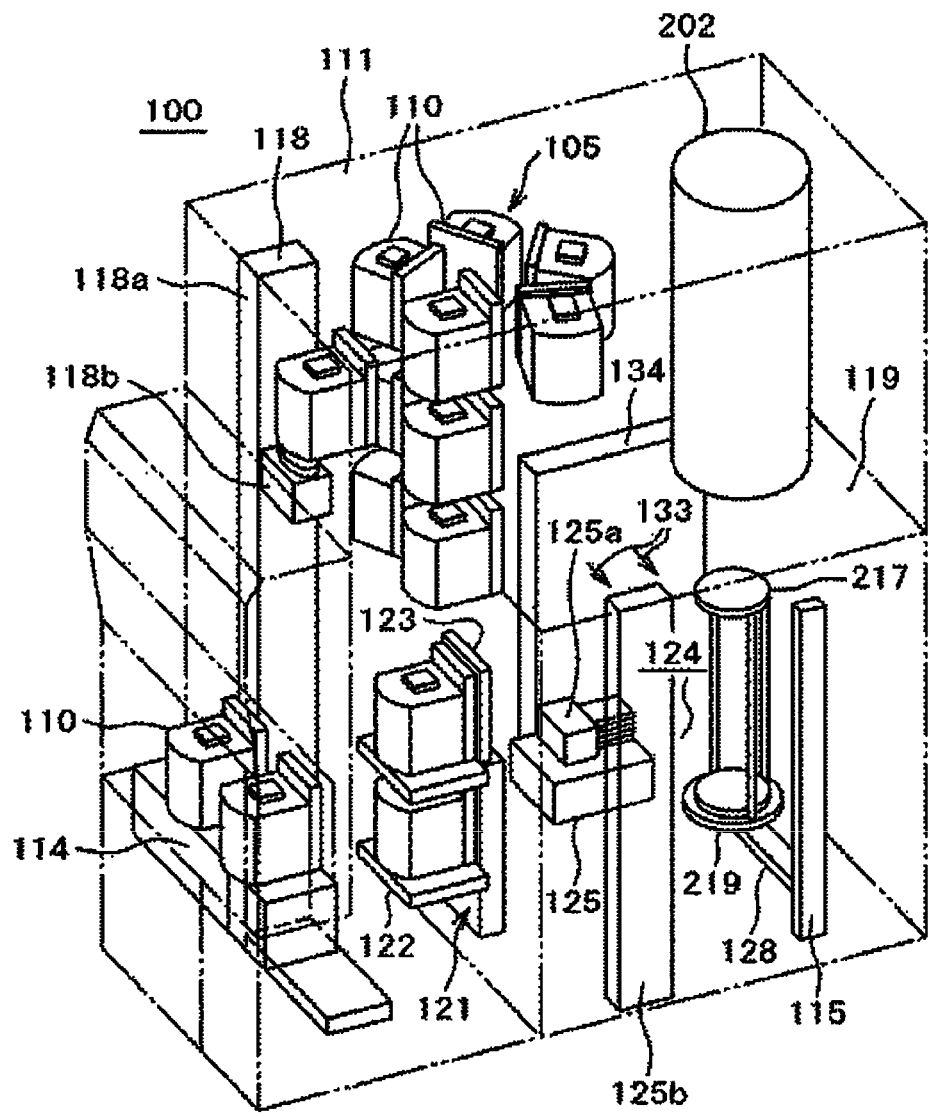
FIG. 1 is a perspective view of a substrate processing apparatus according to an embodiment of the present disclosure.
Figure 2:
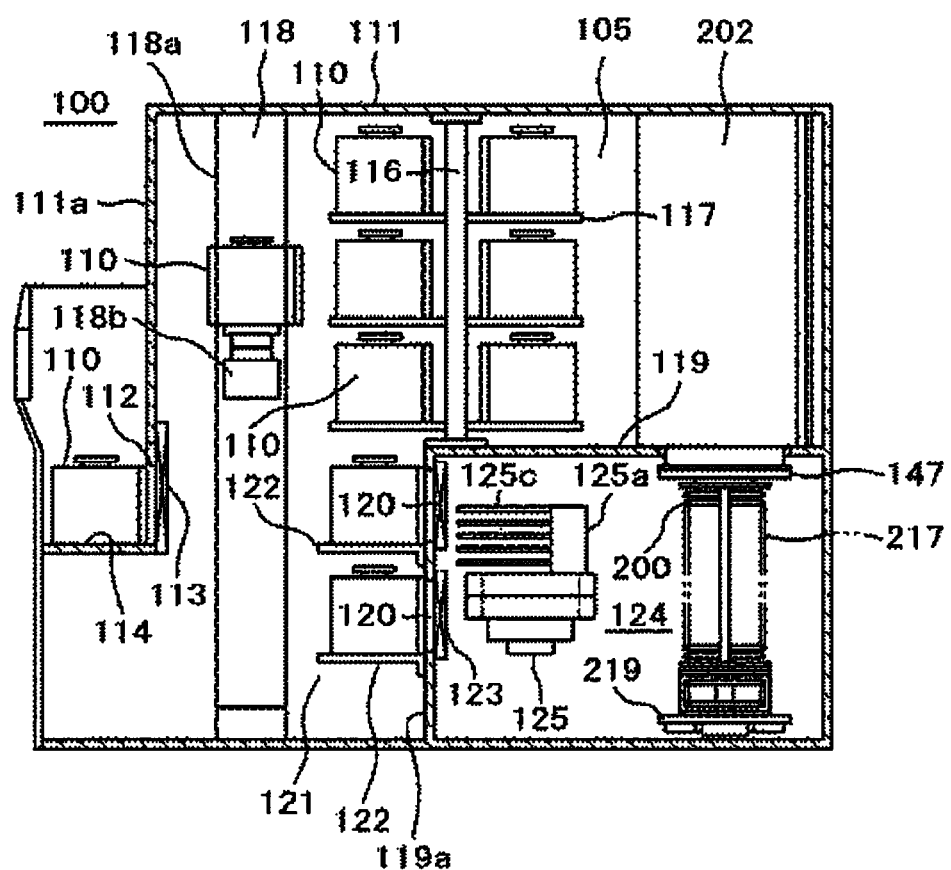
FIG. 2 is a side transparent view of the substrate processing apparatus according to an embodiment of the present disclosure.

A substrate processing apparatus according to an embodiment of the present disclosure will now be described in detail with reference to the accompanying drawings. In the present embodiment, the substrate processing apparatus is configured as, for example, a semiconductor manufacturing apparatus which implements a processing process in a method for manufacturing a semiconductor device (IC: Integrated Circuit). Furthermore, the substrate processing apparatus of the present embodiment is configured as a two-boat apparatus which alternately uses two boats with respect to a single processing furnace. In the following embodiment, descriptions will be made on a case where a batch-type vertical semiconductor manufacturing device (hereinafter simply referred to as a processing apparatus) which performs a film forming process such as a CVD process or the like with respect to substrates is used as the substrate processing apparatus. FIG. 1 is a perspective transparent view of a processing apparatus to which the present disclosure is applied. FIG. 2 is a side transparent view of the processing apparatus illustrated in FIG. 1. In FIGS. 1 and 2, a boat replacement device is omitted in order to make the figures easily understandable.

As illustrated in FIGS. 1 and 2, the processing apparatus 100 of the present embodiment uses a pod 110 as a wafer carrier (a substrate container) which accommodates wafers (substrates) 200 made of silicon or the like. The processing apparatus 100 includes a housing 111. A pod carry-in/carry-out port 112 is formed in the front wall 111a of the housing 111 so that the interior and exterior of the housing 111 communicate with each other through the pod carry-in/carry-out port 112. The pod carry-in/carry-out port 112 is opened and closed by a front shutter 113. A load port 114 is provided at the front side of the pod carry-in/carry-out port 112. The load port 114 mounts the pod 110. The pod 110 is carried onto the load port 114 by an in-process conveying device (not illustrated) and is carried out from the load port 114.

A rotary rack 105 is installed in an upper portion of a substantially central region of a front-rear direction within the housing 111. The rotary rack 105 rotates about a post 116 and stores a plurality of pods 110 on the rack plates 117 thereof. As illustrated in FIG. 2, a pod conveying device 118 is installed between the load port 114 and the rotary rack 105 within the housing 111. The pod conveying device 118 includes a pod elevator 118a capable of moving up and down while holding the pod 110 and a pod conveying mechanism 118b as a horizontal conveying mechanism. The pod conveying device 118 conveys the pod 110 between the load port 114, the rotary rack 105 and the pod opener 121.

As illustrated in FIG. 2, a sub housing 119 is built in a lower portion of a substantially central region of a front-rear direction within the housing 111 so as to extend to a rear end portion of the housing 111. In a front wall 119a of the sub housing 119, a pair of wafer carry-in/carry-out ports 120 for carrying wafers 200 into and out of the sub housing 119 is formed at two upper and lower stages in a vertical direction. A pair of pod openers 121 and 121 is respectively installed in the wafer carry-in/carry-out ports 120 and 120 of the upper and lower stages. Each of the pod openers 121 includes a mounting table 122 or 122 which mounts the pod 110 thereon and a cap attaching/detaching mechanism 123 or 123 which attaches or detaches a cap (a lid) of the pod 110. Each of the pod openers 121 opens or closes a wafer removal/insertion opening of the pod 110 by causing the cap attaching/detaching mechanism 123 to attach or detach the cap of the pod 110 mounted on the mounting table 122. The mounting table 122 is a transfer rack on which the substrate container is mounted when transferring the substrates.

As illustrated in FIG. 2, the sub housing 119 defines a transfer chamber 124 isolated from the atmosphere of the installation space of the pod conveying device 118 and the rotary rack 105. A wafer transfer mechanism 125 as a substrate transfer part is installed in a front region of the transfer chamber 124. The wafer transfer mechanism 125 includes a wafer transfer device 125a capable of mounting the wafers 200 on tweezers 125c and capable of horizontally rotating and linearly moving the wafers 200, and a wafer transfer device elevator 125b for moving the wafer transfer device 125a up and down. The wafers 200 are mounted (loaded) and removed (unloaded) to and from the boat 217 by virtue of the continuous operations of the wafer transfer device elevator 125b and the wafer transfer device 125a.

As illustrated in FIG. 1, a clean unit 134 including a supply fan and a dustproof filter is installed within the transfer chamber 124 so as to supply a clean air 133 which is a purified atmospheric gas or inert gas. As illustrated in FIG. 2, a processing furnace 202 is installed above the boat 217. The processing furnace 202 includes a substrate process chamber (not illustrated and hereinafter referred to as a process chamber) defined therein. A heater (not illustrated) configured to heat the interior of the process chamber is provided around the process chamber. The lower end portion of the processing furnace 202 is opened and closed by a furnace opening gate valve 147.

As illustrated in FIG. 1, there is installed a boat elevator 115 for moving the boat 217 up and down. A seal cap 219 is horizontally mounted to an arm 128 connected to the boat elevator 115. The seal cap 219 is configured to vertically support the boat 217 and to seal the lower end portion of the processing furnace 202. The boat 217 is a substrate holder provided with a plurality of holding members. The boat 217 is configured to horizontally hold a plurality (e.g., about 50 to 125) of wafers 200 in a vertically aligned state with the centers thereof aligned with each other. A plurality of dummy wafers is mounted to the upper end portion and the lower end portion of the boat 217. Product wafers are mounted between the dummy wafers of the upper end portion and the dummy wafers of the lower end portion. The same dummy wafers are used during the time when a batch process is performed multiple number of times while replacing the product wafers.

Figure 3:
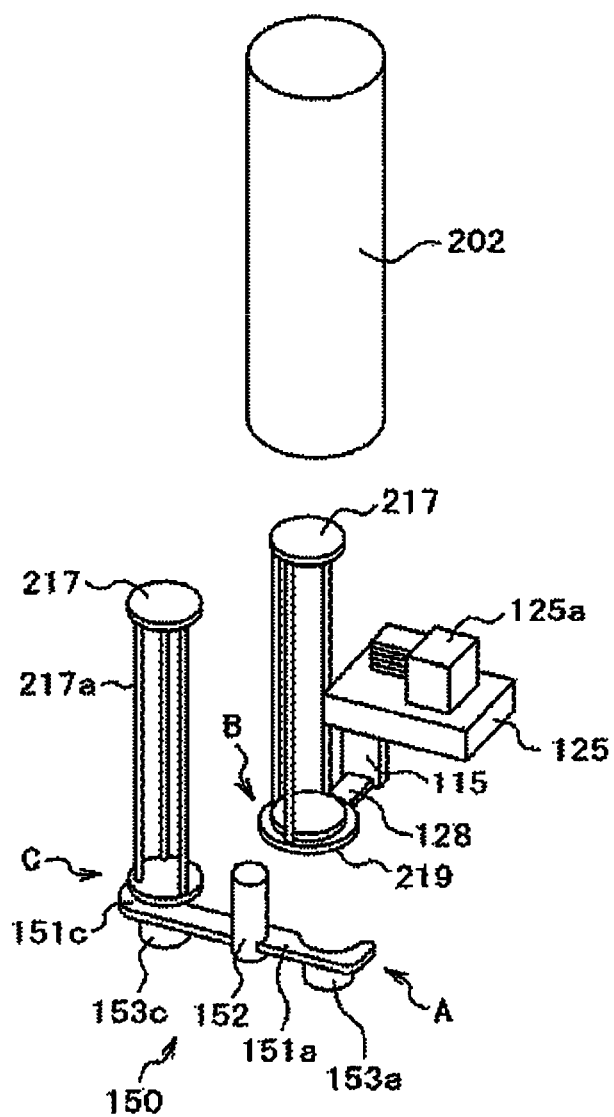
FIG. 3 is a perspective view of a boat replacement device according to an embodiment of the present disclosure.
Figure 4:
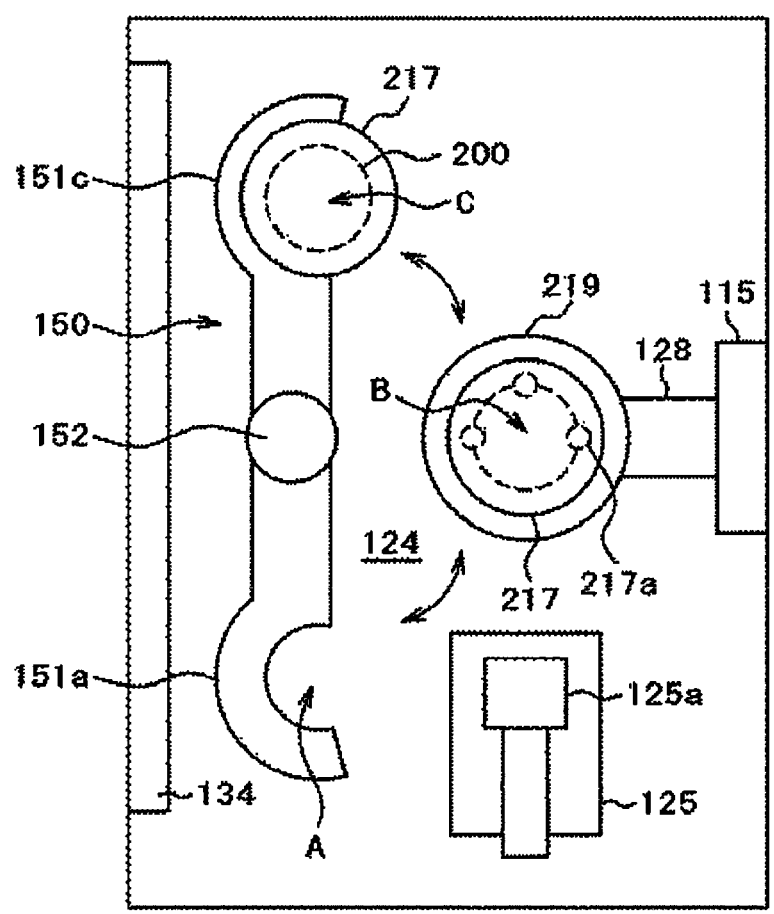
FIG. 4 is a top view of the boat replacement device according to an embodiment of the present disclosure.

As illustrated in FIGS. 3 and 4, a boat replacement device 150 as a boat conveying device which replaces the boat 217 that holds the wafers 200 to be processed within the processing furnace 202 is installed between the boat elevator 115 and the clean unit 134 within the transfer chamber 124. FIGS. 3 and 4 are perspective and top views of the boat replacement device 150 according to an embodiment of the present disclosure. As illustrated in FIG. 4, a wafer transfer position A, a boat lowering position B and a boat retracting position C are disposed at corners of a triangle.

First, an operating method of the two-boat device will be briefly described. It is assumed that in an initial state, empty boats 271 not holding the wafers 200 are located in the wafer transfer position A and the boat retracting position C. First, unprocessed wafers 200 are transferred from the pod 110 mounted on the pod opener mounting table 122 to the boat 217 (boat A) existing in the wafer transfer position A. Then, the boat A holding the unprocessed wafers 200 is conveyed to the boat lowering position B by the boat replacement device 150.

The boat A conveyed to the boat lowering position B is carried into the processing furnace 202 by the boat elevator 115. The wafers 200 existing on the boat A are subjected to a process such as a film forming process or the like. After the boat A is carried into the processing furnace 202, the boat 217 (boat B) located in the boat retracting position C is conveyed to the wafer transfer position A by the boat replacement device 150. Then, the unprocessed wafers 200 are transferred from the pod 110 mounted on the pod opener mounting table 122.

If the processing performed within the processing furnace 202 is completed, the boat A is lowered to the boat lowering position B and is then conveyed to the boat retracting position C by the boat replacement device 150. The boat A waits in the boat retracting position C until the temperature of the processed wafers 200 mounted to the boat A is lowered to a predetermined temperature.

After the boat A is conveyed to the boat retracting position C, the boat B is conveyed to the boat lowering position B by the boat replacement device 150 and is then carried into the processing furnace 202 by the boat elevator 115. The wafers 200 existing on the boat B are subjected to a process such as a film forming process or the like. Thereafter, the boat B performs the same operations as the operations of the boat A.

After the temperature of the wafers 200 mounted to the boat A is lowered to a predetermined temperature in the boat retracting position C and after the boat B is carried into the processing furnace 202, the boat A is conveyed to the wafer transfer position A by the boat replacement device 150. Then, the processed wafers 200 existing on the boat A are transferred to the pod 110 mounted on the pod opener mounting table 122.

Next, the configuration and operation of the boat replacement device 150 will be described in detail. The boat replacement device 150 includes two boat support arms 151a and 151c supported by an arm post 152. The boat support arms 151a and 151c are capable of operating independently of each other and are configured to perform a horizontal rotation operation about the arm post 152 and an axial up/down movement operation along the arm post 152. Specifically, the boat support arm 151a can make horizontal rotation between the wafer transfer position A and the boat lowering position B. The boat support arm 151c can make horizontal rotation between the boat retracting position C and the wafer transfer position A.

The wafer transfer position A refers to a position where the wafers are transferred by the wafer transfer mechanism 125 between the boat 217 located in the wafer transfer position A and the pod 110 mounted on the pod opener mounting table 122. A boat stand 153a which supports the boat 217 is installed in the wafer transfer position A. In the wafer transfer position A, unprocessed wafers 200 are transferred from the pod 110 to the empty boat 217 placed on the boat stand 153a. Furthermore, processed wafers 200 are transferred from the boat 217 placed on the boat stand 153a and mounted with the processed wafers 200 to the empty pod 110.

The boat lowering position B refers to a position where the boat 217 is lowered by the boat elevator 115. The boat 217 to which the unprocessed wafers 200 are mounted in the wafer transfer position A is conveyed to the boat lowering position B by the boat support arm 151a of the boat replacement device 150 and is placed on the seal cap 219 in the boat lowering position B. Thereafter, the boat 217 is carried into the processing furnace 202 (boat loading). Furthermore, the boat 217 to which the processed wafers 200 are mounted is carried out from the interior of the processing furnace 202 to the boat lowering position B and is lowered by the boat elevator 115 (boat unloading).

The boat retracting position C refers to a position where the boat 217 to which the processed wafers 200 are mounted is retracted for a predetermined time in order to, for example, cool the processed wafers 200. A boat stand 153c which supports the boat 217 is installed in the boat retracting position C. The boat 217 to which the processed wafers 200 are mounted is lowered from the interior of the processing furnace 202 to the boat lowering position B. Thereafter, the boat 217 is conveyed to the boat retracting position C by the boat support arm 151c and is placed on the boat stand 153c.

The boat 217 located in the boat retracting position C waits for a predetermined time as described above. Thereafter, the boat 217 is conveyed to the wafer transfer position A through the boat lowering position B by the boat support arm 151c and is placed on the boat stand 153a. Then, in the wafer transfer position A, the processed wafers 200 are transferred from the boat 217 to the empty pod 110. Thereafter, the unprocessed wafers 200 are transferred from another pod 110 to the boat 217.

As described above, the boat support arm 151a is capable of performing a horizontal rotation operation between the wafer transfer position A and the boat lowering position B. Thus, the boat 217 placed on the boat stand 153a can be mounted on the seal cap 219 in the boat lowering position B.

As set forth above, the boat support arm 151c is capable of performing a horizontal rotation operation between the boat retracting position C and the boat lowering position B and between the boat retracting position C and the wafer transfer position A. Thus, the boat 217 mounted on the seal cap 219 in the boat lowering position B can be placed on the boat stand 153c existing in the boat retracting position C. Furthermore, the boat 217 placed on the boat stand 153c can be placed on the boat stand 153a existing in the wafer transfer position A.

The boat 217 is provided at its bottom with a cylindrical columnar structure (not illustrated) fitted to an arc-shaped boat gripping portion (see FIG. 4) of each of the boat support arms 151a and 151c. The boat replacement device 150 conveys the boat 217 in a state in which the cylindrical columnar structure of the boat 217 is fitted to the boat gripping portion of each of the boat support arms 151a and 151c.

Figure 5:
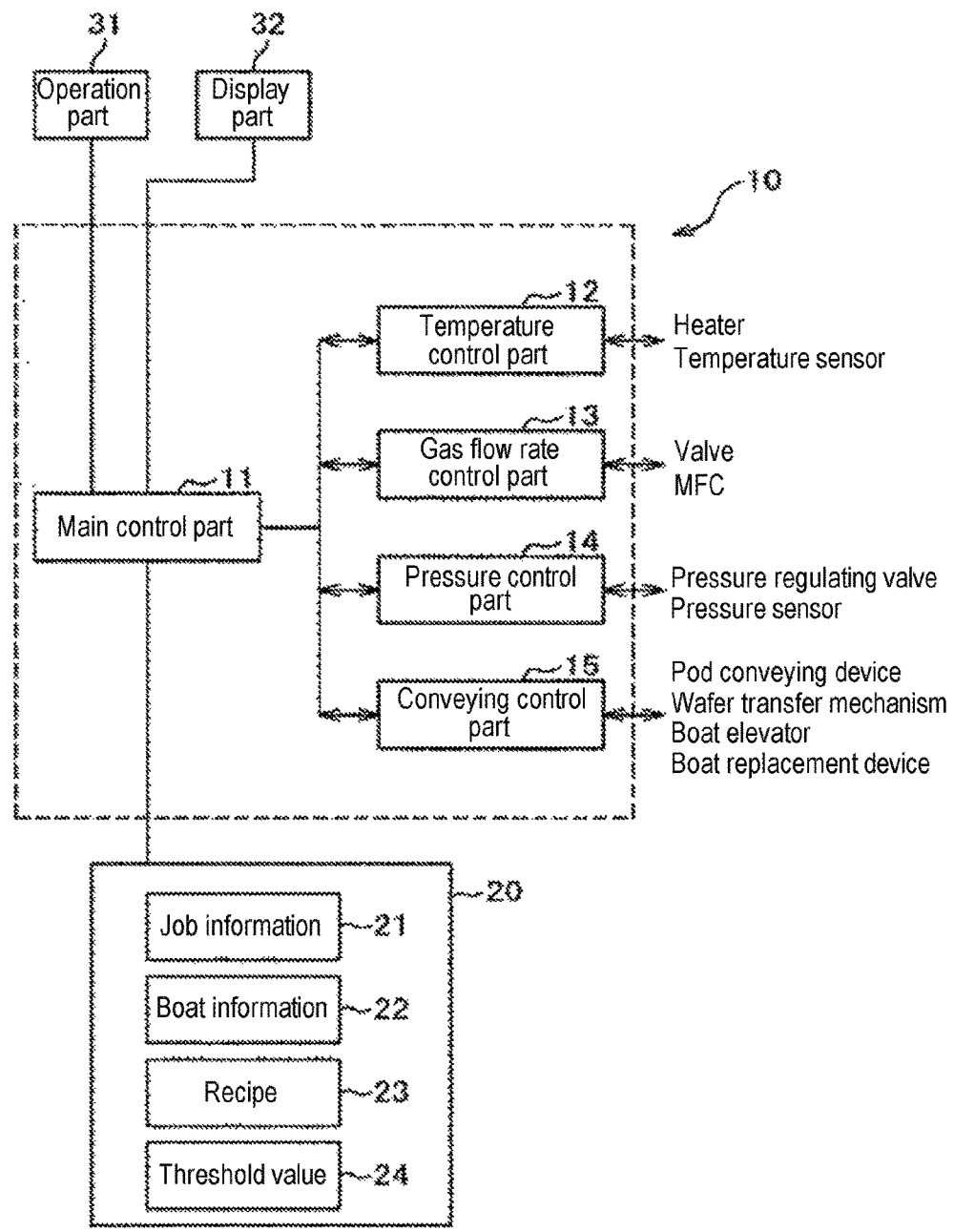
FIG. 5 illustrates a configuration example of a control part and a storage part of the substrate processing apparatus according to an embodiment of the present disclosure.

Next, the configurations of a control part and a storage part of the processing apparatus will be described with reference to FIG. 5. FIG. 5 illustrates a configuration example of a control part and a storage part of the substrate processing apparatus according to the present embodiment. As illustrated in FIG. 5, the control part 10 includes a main control part 11, a temperature control part 12, a gas flow rate control part 13, a pressure control part 14 and a conveying control part 15. Constituent parts that constitute the processing apparatus 100, such as a temperature control part 12, a gas flow rate control part 13, a pressure control part 14, a conveying control part 15, an operation part 31 which receives instructions from an operator, a display part 32 which displays operation screens or various kinds of data, a storage part 20 which stores a process recipe as a substrate processing sequence of the processing apparatus 100, and so forth, are electrically connected to the main control part 11. In the case of using, e.g., a touch panel, the operation part 31 and the display part 32 may be formed into one piece.

The temperature control part 12 is configured to control the temperature of a heater which heats the processing furnace 202. The temperature control part 12 receives temperature data from a temperature sensor for measuring the internal temperature of the processing furnace 202 and transmits the temperature data to the main control part 11. In addition, the temperature control part 12 receives, for example, an instruction indicating the heating temperature of the heater for increasing the internal temperature of the processing furnace 202, from the main control part 11 and operates the heater so that the internal temperature of the processing furnace 202 becomes an instructed temperature.

The gas flow rate control part 13 receives, for example, gas flow rate data from an MFC (flow rate controller) installed in a process gas supply pipe for supplying a process gas into the processing furnace 202 and transmits the gas flow rate data to the main control part 11. In addition, the gas flow rate control part 13 receives, for example, a gas control instruction such as a valve opening/closing instruction for an on/off valve installed in a process gas supply pipe, a pump driving instruction, or the like and executes gas flow rate control pursuant to the gas control instruction.

The pressure control part 14 receives internal pressure information of the processing furnace 202 from a pressure sensor installed in an exhaust pipe for exhausting a gas from the interior of the processing furnace 202 and transmits the internal pressure information to the main control part 11. In addition, the pressure control part 14 receives a valve opening degree instruction or a pump driving instruction for a pressure regulating valve or a pump installed in the exhaust pipe, from the main control part 11 and controls the internal pressure of the processing furnace 202 pursuant to the instruction.

The conveying control part 15 is configured to control the positions and operations of the pod conveying device 118, the wafer transfer mechanism 125, the boat elevator 115 and the boat replacement device 150. Pod sensors (not illustrated) installed in the load port 114, the rack plates 117 and the mounting table 122, and boat sensors (not illustrated) installed in the boat stands 153a and 153c and the seal cap 219, are electrically connected to the conveying control part 15. The conveying control part 15 receives, for example, data on the presence or absence and the position of the pod 110 for accommodating the wafers 200 and data on the existence or non-existence of the boat 217 in the boat stands 153a and 153c and the seal cap 219, from the sensors and transmits the data to the main control part 11. In addition, the conveying control part 15 receives, for example, conveying instructions of the pod 110, the boat 217 and the wafers 200 from the main control part 11 and conveys the pod 110, the boat 217 and the wafers 200 to instructed places or positions.

The main control part 11 includes, as hardware configurations, a CPU (Central Processing Unit) and a memory which stores an operation program of the main control part 11 or the like. The CPU is operated to download the recipe stored in the storage part 20 into the memory and to execute the downloaded recipe, for example, based on an operator's instruction from the operation part 31 and according to the operation program. At this time, the main control part 11 causes the respective auxiliary control parts such as the temperature control part 12, the gas flow rate control part 13, the pressure control part 14 and the conveying control part 15 to measure the internal temperature of the process chamber, the internal pressure of the process chamber, the gas flow rate and the like. Based on the measured data, the main control part 11 outputs control signals to the respective auxiliary control parts and controls the respective auxiliary control parts so as to operate according to the recipe.

The storage part 20 is formed of an EEPROM, a flash memory, a hard disk or the like. The storage part 20 includes a storage medium which stores the operation program of the CPU and a storage medium which stores the recipe. The operation program stored in the storage part 20 is transmitted to the memory of the main control part 11 and is operated, for example, at the startup of the processing apparatus 100.

As illustrated in FIG. 5, the storage part 20 includes at least a job information storage part 21, a boat information storage part 22, a recipe storage part 23 and a threshold value storage part 24. The job information storage part 21 stores one or more of job information that designate substrate processing to be implemented by the processing apparatus 100. The term "job" refers to a series of processes of mounting the wafers 200 to the boat 217 and carrying the boat 217 into the processing furnace 202, processing the wafers 200 within the processing furnace 202, then carrying the boat 217 out of the processing furnace 202 and removing the wafers 200 from the boat 217.

FIG. 6 illustrates one example of job information stored in the job information storage part 21 according to the present embodiment. As illustrated in FIG. 6, one job information includes a job name which specifies the job information, material specifying information which specifies a material to be used in the job, number specifying information which specifies the number of the wafers 200 to be processed in the job, boat specifying information which specifies the boat 217 to be used in the job, and recipe specifying information which specifies the recipe to be used in the job. The material specifying information indicates which of the pods 110 is to be used in the job, namely which of the wafers 200 accommodated within the pods 110 is to be used in the job. The material specifying information is expressed by a processing lot ID (identification number) affixed to each of the pods 110.

In the example illustrated in FIG. 6, the job having a job name JOB-01 indicates that 50 wafers 200 accommodated within the pod 110 having a lot ID 01 are mounted to the boat A and are processed within the processing furnace 202 according to recipes A, B and C.

Job information other than the boat specifying information, namely the job name, the material specifying information, the number specifying information and the recipe specifying information may be, for example, inputted and set by an operator using the operation part 31. The boat specifying information is set by the control part 10 in the following manner. That is to say, after the processing apparatus 100 is started up, the control part 10 sets the boat initially existing in the wafer transfer position A as a boat A and then sets the boat A as a boat to be used at a first job implemented at first. Furthermore, the control part 10 sets the boat initially existing in the boat retracting position C as a boat B and then sets the boat B as a boat to be used at a second job implemented second. Thereafter, the control part 10 grasps the positions of the boat A and the boat B (the wafer transfer position A, the boat lowering position B and the boat retracting position C) each time when the boat A and the boat B are moved. Thus, the control part 10 can recognize which of the boat A and the boat B is the boat 217 existing in each position.

The job information may be configured to so as not to designate the material (the pod 110) to be used. In this case, the processing apparatus 100 properly selects one of the pods 110 accommodating unprocessed wafers 200, which are placed on the rack plates 117, and mounts the selected pod 110 on the pod opener mounting table 122.

The boat information storage part 22 stores information on the boat 217 currently used in the processing apparatus 100. FIG. 7 illustrates one example of the boat information stored in the boat information storage part 22 according to the present embodiment. As illustrated in FIG. 7, one boat information includes a boat name which specifies the boat information, boat state information which specifies the state of the boat in the processing apparatus 100, boat position information which specifies the position of the boat in the processing apparatus 100, and cumulative film thickness information which specifies a cumulative film thickness value as a processing history of the boat. The boat state information indicates whether the wafers 200 of the boat are being processed, are waiting for processing or are being retracted after processing. The boat position information indicates whether the position of the boat is the wafer transfer position A, the boat lowering position B or the boat retracting position C.

In the example illustrated in FIG. 7, the boat A waits in the wafer transfer position A and the cumulative film thickness value of the boat A is 100 µm. In the case of the two-boat system of the present embodiment, at least two boats 217 are used. Therefore, two kinds of boat information, for example, boat information on boats A and B, are needed.

The boat information is set by the control part 10 in the following manner. That is to say, as described above, after the processing apparatus 100 is started up, the control part 10 sets the boat 217 initially existing in the wafer transfer position A as a boat A and sets the boat 217 initially existing in the boat retracting position C as a boat B. At this time, the boat information of the boat A is set such that the boat state information indicates the waiting state, the boat position information indicates the wafer transfer position A, and the cumulative film thickness value becomes zero. At this time, the boat information of the boat B is set such that the boat state information indicates the retracting state, the boat position information indicates the boat retracting position C, and the cumulative film thickness value becomes zero. The boat information is set with reference to the information transmitted from the aforementioned boat sensors.

Thereafter, each time when the boat A and the boat B are moved, the control part 10 grasps the positions thereof (the wafer transfer position A, the boat lowering position B and the boat retracting position C) and the states thereof (the waiting state, the processing state and the retracting state), and reflects the grasped positions and states in the boat information of the boat information storage part 22. Moreover, each time when the wafers 200 held in the boat A and the boat B are processed within the processing furnace 202, the control part 10 adds the cumulative film thickness values of the boat information of the boat A and the boat B. In this way, the control part 10 can always recognize the position, state and cumulative film thickness value of each of the boat A and the boat B.

The recipe storage part 23 stores plural kinds of recipes including a process recipe for performing substrate processing, for example, a recipe A for forming a film having a thickness A on the surface of each of the wafers 200 and a recipe B for forming a film having a thickness B on the surface of each of the wafers 200. One recipe is usually formed of a plurality of processing steps. A plurality of process parameters for processing substrates is included in each of the process steps. For example, as the process parameters, a step time required in performing a process step and an internal temperature of the processing furnace 202 at the process step are included in the recipe.

The threshold value storage part 24 stores information on the timing at which the boat 217 used in the processing apparatus 100 is replaced. In the present embodiment, the threshold value storage part 24 stores a threshold value s on the cumulative film thickness value of the boat 217. For example, the threshold value s may be inputted and set by an operator using the operation part 31. If the cumulative film thickness value of the boat 217 which has been subjected to a plurality of film forming processes reaches the threshold value s stored in the threshold value storage part 24, the main control part 11 causes the display part 32 to display the fact that the cumulative film thickness value of the boat 217 has reached the threshold value s, thereby urging a maintenance worker to replace the boat.

Next, descriptions will be made on one operation example of the processing apparatus 100 according to the present embodiment. In this operation example, the operations are controlled by the control part 10 unless specifically mentioned to be performed by a maintenance worker. First, in a maintenance mode state of the processing apparatus 100, a maintenance door (not illustrated) installed in the housing 111 is opened by a maintenance worker. The boat A and the boat B not mounted with the wafers 200 and kept in an empty state are placed by a maintenance worker on the boat stand 153a located in the wafer transfer position A illustrated in FIG. 3 and on the boat stand 153c located in the boat retracting position C illustrated in FIG. 3. At this time, the boat A and the boat B are precisely aligned by the visual observation of a maintenance worker so that the boat A and the boat B are placed in predetermined positions.

The boat A and the boat B used at this time are boats to which films are not attached. That is to say, the boat A and the boat B are new boats 217 which are not subjected to processing or boats 217 from which the films attached in the previous processing are removed by cleaning.

Next, a maintenance worker performs teaching by which the position of the wafer transfer mechanism 125 during the wafer transfer is stored in the storage part 20 so that the wafers 200 can be mounted in the predetermined positions of the boat A when the wafer transfer mechanism 125 transfers the wafers 200 to the boat A existing in the wafer transfer position A. Subsequently, operation checks of the processing apparatus 100, for example, an automatic self-check and a maintenance worker's manual check of the respective constituent parts such as the control part 10 and the like, are performed. If the check result is normal, the startup of the processing apparatus 100 is instructed by a maintenance worker. As startup operations, for example, a temperature increasing operation of heating the interior of the processing furnace 202 to a predetermined temperature, an operation of filling the interior of the transfer chamber 124 with the clean air 133, an operation of storing the job information in the job information storage part 21 and an operation of storing the boat information in the boat information storage part 22, are performed.

In this operation example, the job information (first job information) for the job implemented at first designates a pod P1 as the material to be used, 25 wafers as the number of wafers to be processed, a boat A as the boat 217 to be used, and a recipe A as the recipe to be used. The job information (second job information) for the job implemented second designates a pod P2 as the material to be used, 25 wafers as the number of wafers to be processed, a boat B as the boat 217 to be used, and a recipe B as the recipe to be used. The job information (third job information) for the job implemented third designates a pod P3 as the material to be used, 25 wafers as the number of wafers to be processed, and a recipe C as the recipe to be used. The job information (fourth job information) for the job implemented fourth designates a pod P4 as the material to be used, 25 wafers as the number of wafers to be processed, and a recipe D as the recipe to be used. Similarly, the fifth to nth job information are stored in the job information storage part 21. In the aforementioned example, the recipe is changed in each of the job information. However, it is also possible for the respective job information to designate the same recipe.

As described above, the material to be used, the wafer number to be processed and the recipe to be used of the job information are set, for example, by an operator using the operation part 31. The boat A existing in the wafer transfer position A is set as the boat to be used of the first job information by the control part 10. The boat B existing in the boat retracting position C is set as the boat to be used of the second job information by the control part 10. The boats to be used of the third to nth job information are not set.

In the boat information of the boat A, the boat state is set as a waiting state, the boat position is set as the wafer transfer position A, and the cumulative film thickness value is set as 0 (zero) μm. In the boat information of the boat B, the boat state is set as a retracting state, the boat position is set as the boat retracting position C, and the cumulative film thickness value is set as 0 (zero) μm. As the threshold value s of the cumulative film thickness value of the film deposited on the boat 217, for example, 300 μm is stored in the threshold value storage part 24 by an operator.

If the startup of the processing apparatus 100 is completed, the processing apparatus 100 comes into an operating state, namely a production mode state, according to an operator's instruction transmitted from the operation part 31. In the operating state described below, the operation of the processing apparatus 100 is controlled by the control part 10. In the operating state, if the pod 110 is supplied to the load port 114 as illustrated in FIGS. 1 and 2, the pod carry-in/carry-out port 112 is opened by the front shutter 113 and the pod 110 is carried into the housing 111 from the pod carry-in/carry-out port 112. The pod 110 thus carried into the housing 111 is automatically conveyed and delivered to the designated rack plate 117 of the rotary rack 105 by the pod conveying device 118.

The pod P1 designated in the first job information is temporarily stored in the rotary rack 105 and is then conveyed to one of the pod openers 121 and transferred to the mounting table 122. Alternatively, the pod P1 may be directly conveyed from the load port 114 to one of the pod openers 121 and transferred to the mounting table 122. At this time, the wafer carry-in/carry-out port 120 of the pod opener 121 is closed by the cap attaching/detaching mechanism 123 and the clean air 133 is circulated through and filled in the transfer chamber 124.

As illustrated in FIG. 2, the cap of the pod P1 mounted on the mounting table 122 is removed by the cap attaching/detaching mechanism 123. Thus, the wafer removal/insertion opening of the pod P1 is opened. Furthermore, each of the wafers 200 existing within the pod P1 is picked up by the wafer transfer mechanism 125 and is transferred and charged to the boat A located in the wafer transfer position A. The wafer transfer mechanism 125 which has delivered the wafer 200 to the boat A returns to the pod P1 and charges the next wafer 200 to the boat A.

During the work in which the wafer 200 is transferred to the boat A by the wafer transfer mechanism 125 in one (upper or lower) pod opener 121, the next pod P2 designated in the second job information is conveyed from the rotary rack 105 or the load port 114 to the other (lower or upper) pod opener 121 by the pod conveying device 118 and the opening work of the pod P2 is simultaneously performed by the pod opener 121.

If the wafers 200 of the number designated in the first job information are charged from the pod P1 to the boat A, the lower end portion of the processing furnace 202 is opened by the furnace opening gate valve 147 and the seal cap 219 is lowered to the boat lowering position B by the boat elevator 115. Then, the boat A located in the wafer transfer position A is conveyed to the boat lowering position B by the boat replacement device 150 and is placed on the seal cap 219 existing in the boat lowering position B. At this time, the state information and the position information, which are the boat information of the boat A, are updated respectively to "the processing state" and the "the boat lowering position B" by the control part 10.

If the boat A is placed on the boat stand 153a, the state information and the position information of the boat A are updated respectively to "the waiting state" and the "the wafer transfer position A". Then, if the boat A is placed on the seal cap 219, the state information and the position information of the boat A are updated respectively to "the processing state" and the "the boat lowering position B". Thereafter, if the boat A is placed on the boat stand 153c, the state information and the position information of the boat A are updated respectively to "the retracting state" and the "the boat retracting position C". The state information and the position information of the boat B are similar to those of the boat A.

After the boat A is placed on the seal cap 219, the seal cap 219 is moved up by the boat elevator 115. Thus, the boat A supported on the seal cap 219 is carried into the process chamber of the processing furnace 202 (boat loading). After the loading of the boat A, the wafers 200 held in the boat A are subjected, within the process chamber, to a film forming process according to the recipe A designated in the first job information. After the film forming process is completed, the seal cap 219, on which the boat A is placed, is drawn out of the processing furnace 202 and is moved down to the boat lowering position B. The boat A moved down to the boat lowering position B is conveyed from the boat lowering position B to the boat retracting position C by the boat replacement device 150 and is cooled on the boat stand 153c.

After the loading of the boat A, in parallel with the film forming process for the wafers 200 of the boat A implemented within the process chamber, the empty boat B located in the boat retracting position C designated in the second job information is conveyed to the wafer transfer position A by the boat replacement device 150. Then, in the wafer transfer position A, the wafers 200 existing within the pod P2 designated in the second job information are transferred to the boat B by the wafer transfer mechanism 125. Then, the boat A is drawn out of the processing furnace 202 and is conveyed to the boat retracting position C. Thereafter, the boat B is conveyed from the wafer transfer position A to the boat lowering position B and is placed on the seal cap 219. Subsequently, the seal cap 219 is moved up by the boat elevator 115. Thus, the boat B is carried into the process chamber of the processing furnace 202 and is subjected to a film forming process according to the recipe B designated in the second job information.

During the film forming process of the boat B, namely while the seal cap 219 is located in the raised position, the boat A cooled in the boat retracting position C is conveyed from the boat retracting position C to the wafer transfer position A by the boat replacement device 150 and is placed on the boat stand 153a.

Subsequently, during the film forming process of the boat B, the processed wafers 200 existing within the boat A placed on the boat stand 153a are transferred by the wafer transfer mechanism 125 into the pod P1 mounted on the mounting table 122. If all the wafers 200 are returned into the pod P1, the cap of the pod P1 is closed by the cap attaching/detaching mechanism 123. The pod P1 is placed on the rotary rack 105 or the load port 114 by the pod conveying device 118. Thereafter, the pod P1 which accommodates the processed wafers 200 is discharged outside the processing apparatus 100.

After the pod P1 is carried out from the mounting table 122, during the film forming process of the boat B, the next pod P3 designated in the third job information is conveyed from the rotary rack 105 or the load port 114 to the pod opener 121 by the pod conveying device 118. In parallel, the empty boat A located in the wafer transfer position A is set as the boat to be used of the third job information. As described above, if the pod 110 designated in the next job information is placed on the pod opener mounting table 122, the empty boat 217 located in the wafer transfer position A at this time is set as the boat to be used of the next job information by the control part 10. Then, the opening work of the pod P3 is performed by the pod opener 121. After the opening of the pod P3, the unprocessed wafers 200 existing within the pod P3 are transferred by the wafer transfer mechanism 125 to the boat A located in the wafer transfer position A.

Then, the boat B is drawn out of the processing furnace 202 after the completion of the film forming process and is conveyed to the boat retracting position C. Thereafter, the boat A is conveyed from the wafer transfer position A to the boat lowering position B by the boat replacement device 150 and is placed on the seal cap 219. Subsequently, the seal cap 219 is moved up by the boat elevator 115. Thus, the boat A is carried into the process chamber of the processing furnace 202 and is subjected to a film forming process according to the recipe C designated in the third job information.

The boat B conveyed to the boat retracting position C is cooled. Thereafter, the boat B performs the same operation as that of the boat A. That is to say, during the film forming process of the boat A implemented according to the third job (the recipe C), the boat B is conveyed to the wafer transfer position A and the processed wafers 200 of the second job are returned to the pod P2. Thereafter, if the next pod P4 designated in the fourth job information is mounted on the pod opener mounting table 122, the empty boat B located in the wafer transfer position A is set as the boat to be used of the fourth job information by the control part 10. Then, the unprocessed wafers 200 existing within the pod P4 are transferred to the boat B.

Thereafter, the boat A and the boat B are alternately carried into the processing furnace 202 in the same procedure as described above. The film forming process, the cooling process, the transfer of the processed wafers 200 from the boat 217 to the pod 110, and the transfer of the unprocessed wafers 200 from the pod 110 to the boat 217 are repeated.

The control part 10 includes a determination part which determines a replacement timing each time when a certain boat 217 is subjected to a film forming process. If the cumulative film thickness value of one of the boat A and the boat B reaches a predetermined threshold value at the replacement timing, the determination part urges a maintenance worker to vacate the boat A and the boat B and to replace the boat A and the boat B. For example, each time when the film forming process is completed, the control part 10 (or the determination part) compares the cumulative film thickness value of the boat 217 subjected to the film forming process with the threshold value s stored in the threshold value storage part 24. If the cumulative film thickness value of the boat 217 reaches the threshold value s stored in the threshold value storage part 24, the control part 10 (or the determination part) causes the display part 32 to display an indication that urges a maintenance worker to vacate the boat A and the boat B and to replace the boat A and the boat B with new boats.

The cumulative film thickness value of the boat 217 may be actually measured by, for example, a film thickness measuring device (not illustrated) installed within the processing apparatus 100. However, it is preferred that a deposited film thickness value per one film forming process in each kind of the recipes is previously found by an experiment or the like and is stored in the storage part 20. Thus, a cumulative film thickness value can be calculated by multiplying the deposited film thickness value per one film forming process by the number of times the film forming process is performed in each of the recipes. In the case where the cumulative film thickness value is found by calculation in this way, it is not necessary to compare the cumulative film thickness value with the threshold value s each time when the film forming process is completed. The control part 10 can determine the boat replacement timing by comparing the calculated cumulative film thickness value with the threshold value s at the stage of startup of the processing apparatus 100.

For example, if the deposited film thickness value per one film forming process in the recipe A is 20 μm and if the deposited film thickness value per one film forming process in the recipe B is 30 μm, the cumulative film thickness value obtained when the film forming process of the recipe A is implemented ten times and the film forming process of the recipe B is implemented three times, is 290 μm (=20×10+ 30×3). Accordingly, in the case where the job information is configured to implement the film forming process of the recipe A ten times and the film forming process of the recipe B ten times using a certain boat 217, the control part 10 can recognize, at the time point preceding the implementation of the film forming process, that if the threshold value is 290 μm, the boat replacement timing will arrive when the film forming process of the recipe A is implemented ten times and the film forming process of the recipe B is implemented three times.

Example 1

As example 1, the operation of the control part 10 in the case where the cumulative film thickness value of the boat B arriving at the threshold value s is detected during the continuous film forming processes implemented by alternately using the boat A and the boat B will be described. During the continuous film forming processes implemented by alternately using the boat A and the boat B, the control part 10 executes control so that the processed wafers 200 are removed from the boat B in the wafer transfer position A after the film forming process of the boat B and so that if the cumulative film thickness value of the boat B arriving at the threshold value s is detected, new unprocessed wafers 200 are not transferred to the boat B located in the wafer transfer position A.

Then, the processing of the boat A subjected to a film forming process within the processing furnace 202 is completed and the boat A is conveyed to the boat retracting position C. Thereafter, the empty boat B located in the wafer transfer position A is conveyed to the boat lowering position B and is carried into the processing furnace 202. After the empty boat B is carried into the processing furnace 202, the cooled boat A is conveyed from the boat retracting position C to the wafer transfer position A where the processed wafers 200 of the boat A are taken out and transferred to the pod 110. Thereafter, if the empty boat B is moved down from the interior of the processing furnace 202 and is conveyed to the boat retracting position C, the operation of the processing apparatus 100 is stopped. The fact that now is the boat replacement timing is displayed on the display part 32.

After a shutdown process of the processing apparatus 100 is performed according a maintenance worker's instruction transmitted from the operation part 31, the processing apparatus 100 is switched to a maintenance mode. The boat A located in the wafer transfer position A and the boat B located in the boat retracting position C are replaced by new boats C and D to which films are not attached. As used herein, the term "shutdown process of the processing apparatus 100" means that, for example, a temperature reducing process of cooling the interior of the processing furnace 202 and the boat 217 to a predetermined temperature and an air substitution process of filling the transfer chamber 124 with the air are performed to bring the processing apparatus 100 into a state in which a maintenance worker can safely replace the boats.

As described above, if the cumulative film thickness value of one of the two boats currently in use reaches the threshold value s, both boats are simultaneously replaced by new boats regardless of the cumulative film thickness value of the other boat. It is therefore possible to save the time for the shutdown, operation check and startup of the processing apparatus 100 involved in the boat replacement. This makes it possible to improve the throughput of the processing apparatus 100.

Example 2

As example 2, the operation of the control part 10 in the case where the control part 10 pre-recognizes that the cumulative film thickness value of the boat A reaches the threshold value s after the tenth film forming process of the boat A will be described. During the continuous film forming processes implemented by alternately using the boat A and the boat B, the control part 10 executes control so that the processed wafers 200 are removed from the boat B in the wafer transfer position A after the film forming process of the boat B implemented immediately before the tenth film forming process of the boat A and so that new unprocessed wafers 200 are not transferred to the boat B.

Then, the processing of the boat A subjected to the tenth film forming process within the processing furnace 202 is completed and the boat A is conveyed to the boat retracting position C. Thereafter, the same operations as those of example 1 are performed. That is to say, after the empty boat B is carried into the processing furnace 202, the cooled boat A is conveyed from the boat retracting position C to the wafer transfer position A where the processed wafers 200 of the boat A are taken out and transferred to the pod 110. The boat B is conveyed to the boat retracting position C. Thereafter, the operation of the processing apparatus 100 is stopped. The fact that now is the boat replacement timing is displayed on the display part 32. Then, a maintenance worker replaces the boat A located in the wafer transfer position A and the boat B located in the boat retracting position C with new boats C and D to which films are not attached.

Even in this case, if the cumulative film thickness value of one of the two boats currently in use reaches the threshold value s, both boats are simultaneously replaced by new boats regardless of the cumulative film thickness value of the other boat. It is therefore possible to save the time for the shutdown, operation check and startup of the processing apparatus 100 required in the boat replacement. This makes it possible to improve the throughput of the processing apparatus 100.

Example 3

As example 3, the operation of the control part 10 in the case where a film forming process is interrupted will be described. In example 3, it is assumed that a film forming process is started from the boat A and further that continuous film forming processes are implemented by alternatively using the boat A and the boat B. Furthermore, it is assumed that the films deposited on the boat A and the boat B in one film forming process are substantially equal in thickness to each other. Moreover, it is assumed that the control part 10 pre-recognizes that the cumulative film thickness value of the boat A reaches the threshold value s when the tenth film forming process of the boat A is implemented based on the twenty first job information. In addition, it is assumed that the interruption of the film forming process is generated because the pod 110 accommodating unprocessed wafers, which is based on the tenth job information, is not mounted on the pod opener mounting table 122 after the fifth film forming process (the ninth job) of the boat A.

During the fifth film forming process (the ninth job) of the boat A, the control part 10 tries to mount the wafers 200 for the fifth film forming process (the tenth job) to the boat B in the wafer transfer position A after the wafers 200 are removed from the boat B which has been subjected to the fourth film forming process (the eighth job). However, the control part 10 cannot transfer new unprocessed wafers 200 to the boat B because the pod 110 designated in the tenth job information is not mounted on the pod opener mounting table 122. The boat B is kept in a standby state in which the boat B waits for the mounting of the wafers 200 for the fifth film forming process (tenth job).

Thereafter, the boat A which has been subjected to the fifth film forming process (the ninth job) is conveyed from the interior of the processing furnace 202 to the boat retracting position C and is cooled. After the cooling of the boat A, if the wafers 200 to be mounted to the boat B located in the wafer transfer position A do not exist, namely if the pod 110 designated in the tenth job information is not mounted on the pod opener mounting table 122, the control part 10 determines that it is a processing interruption state in which the wafers 200 cannot be mounted to the empty boat B located in the wafer transfer position A. If it is determined to be the processing interruption state, the empty boat B located in the wafer transfer position A is first carried into the processing furnace 202 so that the boat A cooled in the boat retracting position C can be conveyed to the wafer transfer position A. During that time, the boat A is conveyed to the wafer transfer position A. Then, the processed wafers 200 of the ninth job are taken out from the boat A and are transferred to the pod 110.

Thereafter, if the empty boat A is kept stopped in the wafer transfer position A, when the pod 110 designated in the tenth job information is mounted on the pod opener mounting table 122 at last, the unprocessed wafers of the pod 110 designated in the tenth job information are charged to the boat A. Thus, the film forming process of the boat A is successively implemented twice before and after the processing interruption. Since the film forming process is biased to the boat A, the film thickness of the boat A becomes larger than the thickness of the boat B.

In this case, the control part 10 executes control so that the positions of the boat A and the boat B are swapped with each other. That is to say, after the empty boat B is carried into the processing furnace 202, the boat A from which the processed wafers 200 have been removed in the wafer transfer position A is conveyed and retracted to the boat retracting position C. Thereafter, the boat B is conveyed from the interior of the processing furnace 202 to the wafer transfer position A where the boat B waits until the pod 110 designated in the tenth job information is mounted on the pod opener mounting table 122.

As described above, if the film forming process is interrupted, the boat finally subjected to the film forming process is located in the boat retracting position C. The boat subjected to the film forming process earlier (just prior to the final film forming process), namely the boat to which the wafers 200 could not be mounted due to the interruption of the film forming process, is located in the wafer transfer position A. It is therefore possible to alternately use the boat A and the boat B in the film forming process. Thus, the cumulative film thickness values of the boat A and the boat B can be made substantially equal to each other. As a result, it is possible to extend the boat replacement timing.

Example 4

Example 4 is also directed to the operation of the control part 10 in the case where a film forming process is interrupted. In example 4, it is assumed that a difference exists between the thicknesses of the films deposited on the boat A and the boat B in each of the film forming processes. Example 4 differs from example 3 on this point. In example 4, similar to example 3, it is assumed that a film forming process is started from the boat A and further that continuous film forming processes are implemented by alternatively using the boat A and the boat B. Furthermore, it is assumed that the control part 10 pre-recognizes that the cumulative film thickness value of the boat A reaches the threshold value s when the tenth film forming process of the boat A is implemented. In addition, it is assumed that the interruption of the film forming process is generated because the pod 110 accommodating unprocessed wafers, which is based on the tenth job information, is not mounted on the pod opener mounting table 122 after the fifth film forming process (the ninth job) of the boat A. However, unlike example 3, it is assumed that a difference exists between the thicknesses of the films deposited on the boat A and the boat B in each of the film forming processes.

Similar to example 3, during the fifth film forming process (the ninth job) of the boat A, the control part 10 tries to mount the wafers 200 for the fifth film forming process (the tenth job) to the boat B in the wafer transfer position A after the wafers 200 are removed from the boat B which has been subjected to the fourth film forming process (the eighth job). However, the control part 10 cannot transfer new unprocessed wafers 200 to the boat B because the pod 110 designated in the tenth job information is not mounted on the pod opener mounting table 122. The boat B is kept in a standby state in which the boat B waits for the mounting of the wafers 200 for the fifth film forming process (tenth job).

Thereafter, the boat A which has been subjected to the fifth film forming process (the ninth job) is conveyed from the interior of the processing furnace 202 to the boat retracting position C and is cooled. After the cooling of the boat A, if the wafers 200 to be mounted to the boat B located in the wafer transfer position A do not exist, namely if the pod 110 designated in the tenth job information is not mounted on the pod opener mounting table 122, the control part 10 determines that it is a processing interruption state in which the wafers 200 cannot be mounted to the empty boat B located in the wafer transfer position A. If it is determined to be the processing interruption state, the empty boat B located in the wafer transfer position A is first carried into the processing furnace 202. During that time, the cooled boat A is conveyed to the wafer transfer position A. Then, the processed wafers 200 are taken out from the boat A and are transferred to the pod 110.

The control part 10 compares the cumulative film thickness values of the boat A and the boat B. That is to say, the control part 10 compares the cumulative film thickness value available until the fifth film forming process (the ninth job) of the boat A with the cumulative film thickness value available until the fourth film forming process (the eighth job) of the boat B. If the cumulative film thickness value of the boat A is smaller than the cumulative film thickness value of the boat B, the control part 10 executes control so that the position of the boat A (the wafer transfer position A) and the position of the boat B (the boat retracting position C) are not swapped with each other. Furthermore, if the cumulative film thickness value of the boat A is equal to or larger than the cumulative film thickness value of the boat B, the control part 10 executes control so that the position of the boat A and the position of the boat B are swapped with each other.

In this way, depending on the cumulative film thickness values which are the processing histories of the boat A and the boat B, determination is made as to whether to swap the position of the boat A and the position of the boat B. It is therefore possible to bring the cumulative film thickness values of the boat A and the boat B close to each other. That is to say, the control part 10 determines the position of the boat A and the position of the boat B so that the cumulative film thickness values of the boat A and the boat B come close to each other. As a result, it is possible to extend the boat replacement timing.

As described above, according to the boat processing execution management in the job continuous operation mode of the present embodiment, the jobs are continuously executed. If the boats do not have an empty place, the number of times the boat processing is executed and the cumulative film thickness values are managed to become substantially uniform. In this case, according to the present embodiment, if one of the boats is used by the number of processing times which requires maintenance, it is possible to simultaneously perform maintenance on both boats. Moreover, it is possible to prolong the operation time period taken until the processing apparatus is stopped to perform maintenance.

Figure 9:
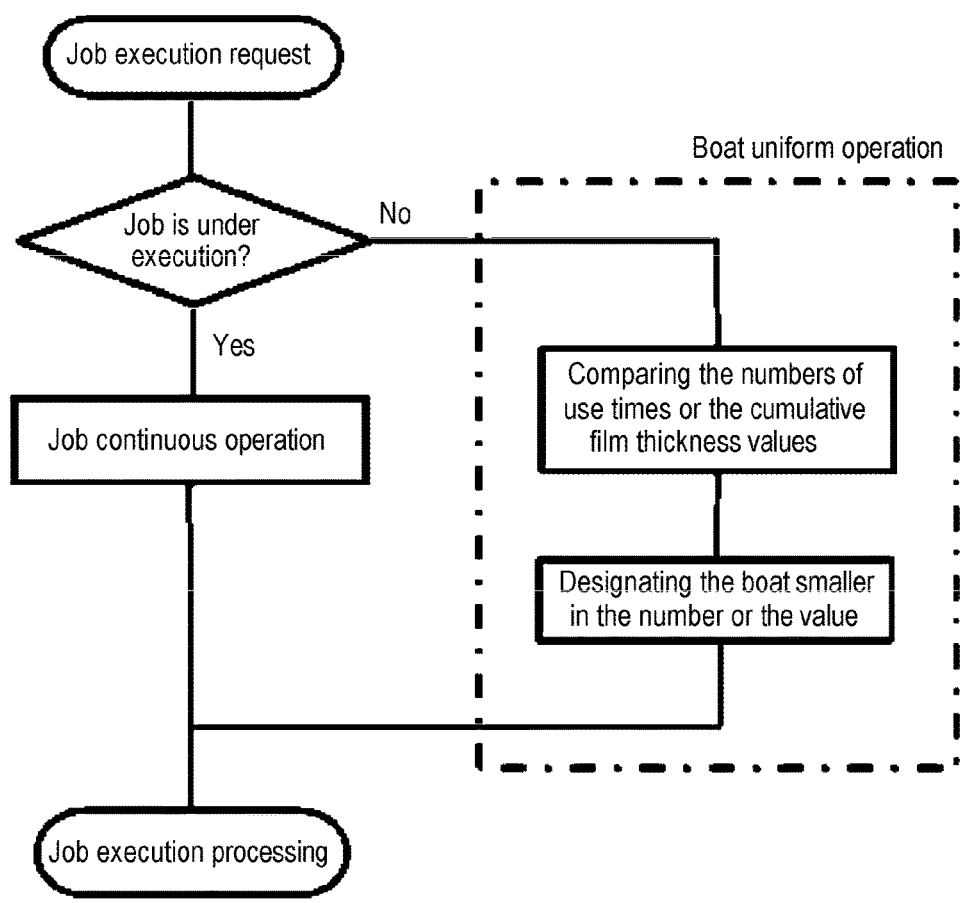
FIG. 9 is a view explaining a processing flow according to an embodiment of the present disclosure.

FIG. 9 is a view illustrating a boat management flow according to the present disclosure. According to FIG. 9, if there is a job execution request, confirmation is made as to whether the job is currently under execution. As a result of the confirmation, if it is determined that the job is under execution, the operation mode becomes the job continuous operation mode described above and the job execution process is performed. On the other hand, if it is determined that the job is not under execution, the boat management is performed in a boat uniform operation mode. Specifically, it is first confirmed whether the substrates (wafers 200) are held on the boat. If the substrates are not held on the boat, it is determined that the current state is a job execution waiting state (in which a job is not executed). Then, the number of times the boat is used or the cumulative film thickness values of the boats are compared between the boats. As a result of the comparison, the boat small in the number of times the boat is used or the cumulative film thickness value is designated. After the boat designation is performed, a job execution process is performed. The job execution process refers to substrate processing. During the boat uniform operation mode (when a job is not executed), the control part 10 executes control so that the boat small in the use frequency is used in order to delay the boat maintenance timing. For example, the number of processing times or the cumulative film thickness value for each of the boats is managed as a criterion for the measurement of the boat use frequency. In the below-mentioned example illustrated in FIGS. 11A to 11H, the boat B is smaller in the number of processing times than the boat A. Thus, the boat B is used in the next job. In addition, the control part 10 is configured to appropriately perform the switching of the job continuous operation mode and the boat uniform operation mode.

Figure 10:
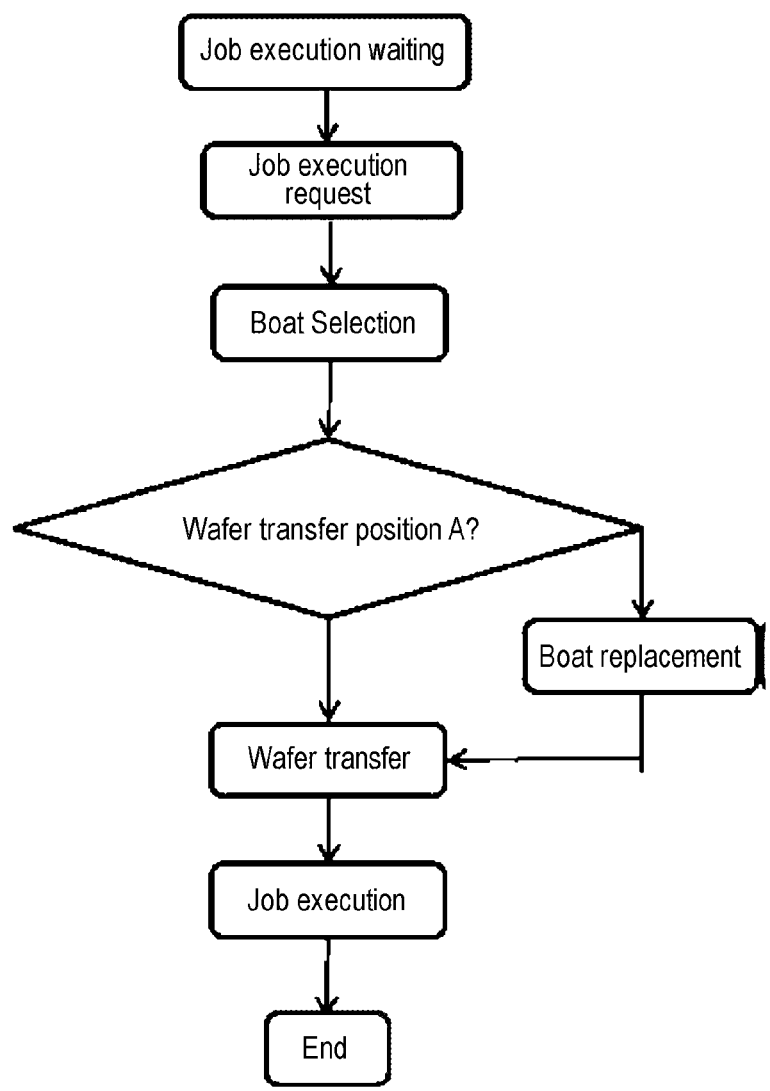
FIG. 10 is a view explaining the details of the processing flow according to an embodiment of the present disclosure.
Figure 11A:
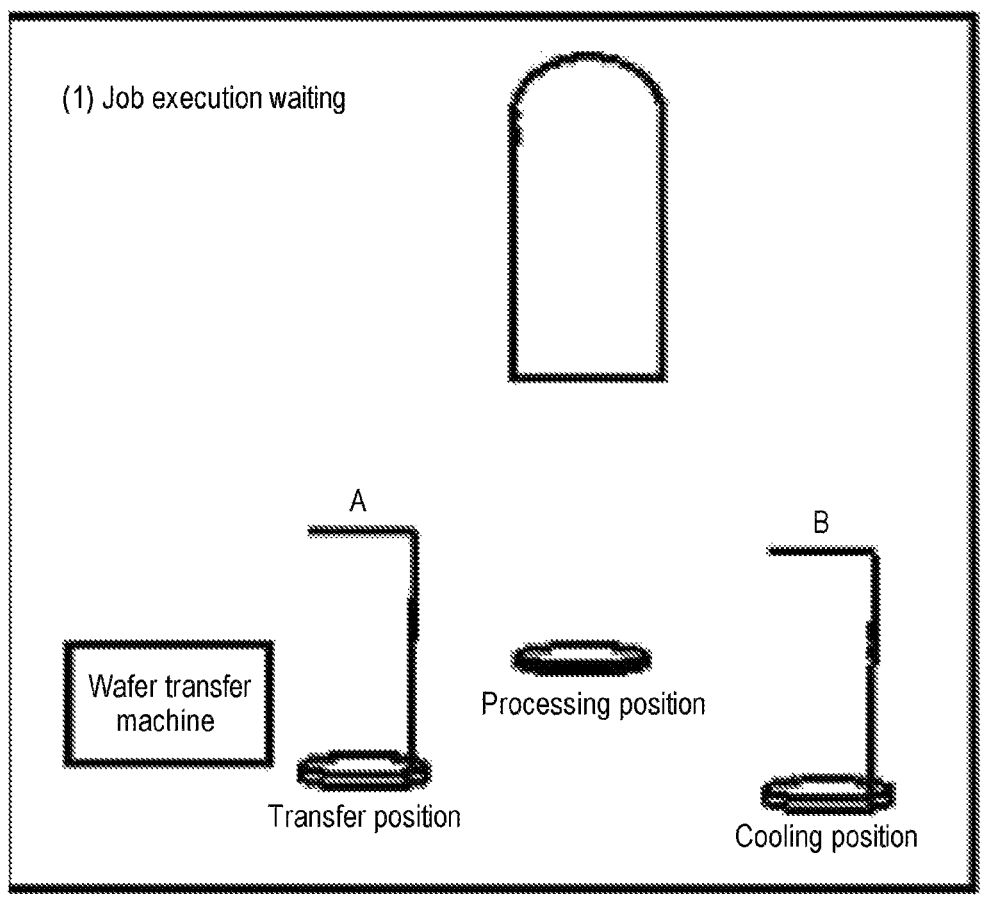
Figure 11B:
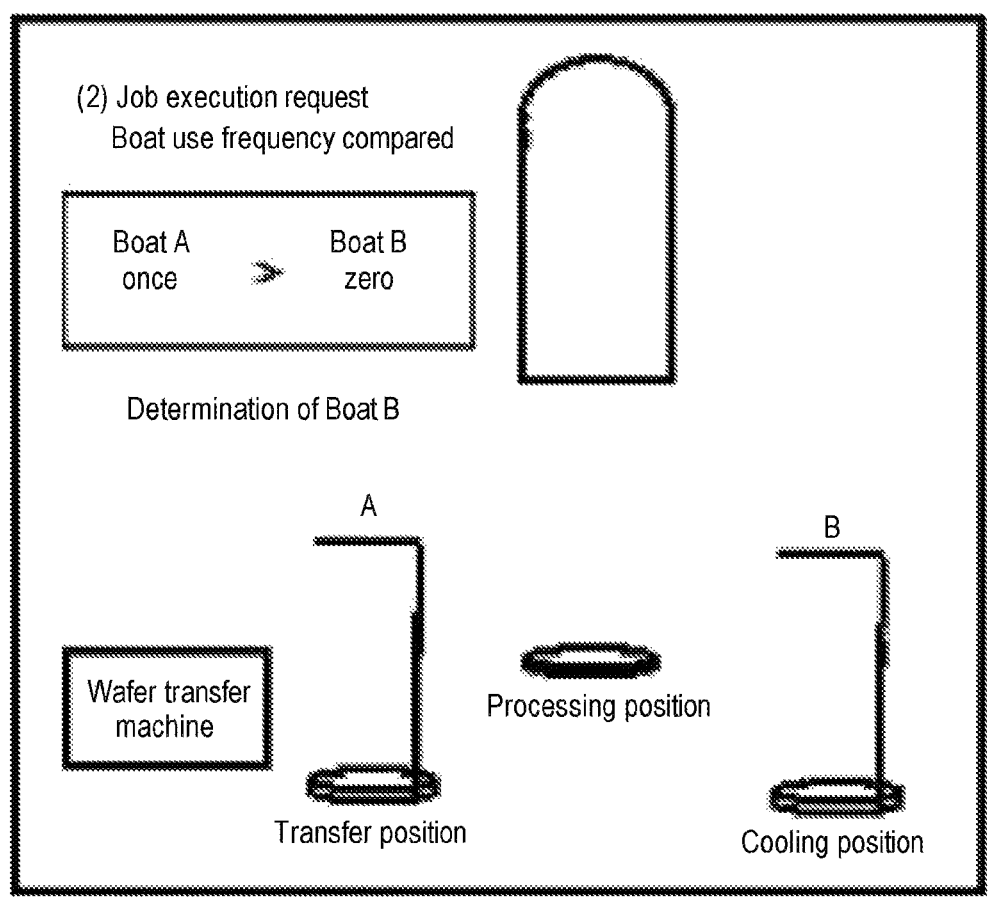
Figure 11D:
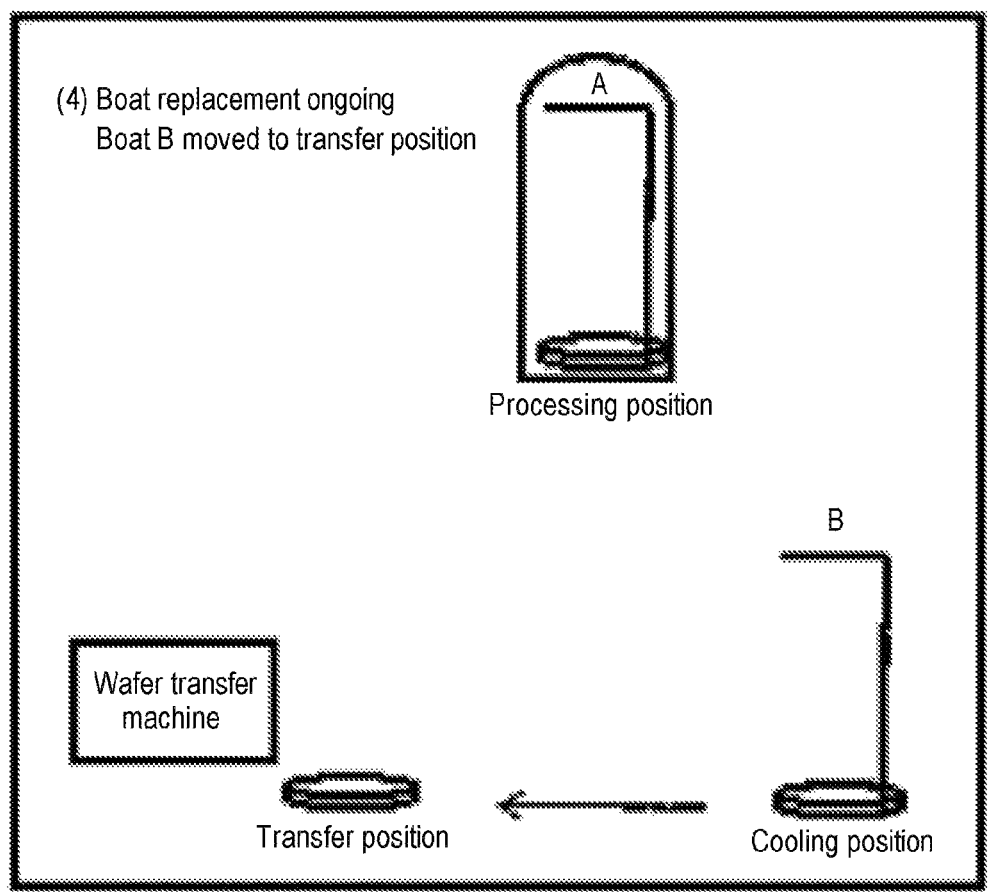
Figure 11E:
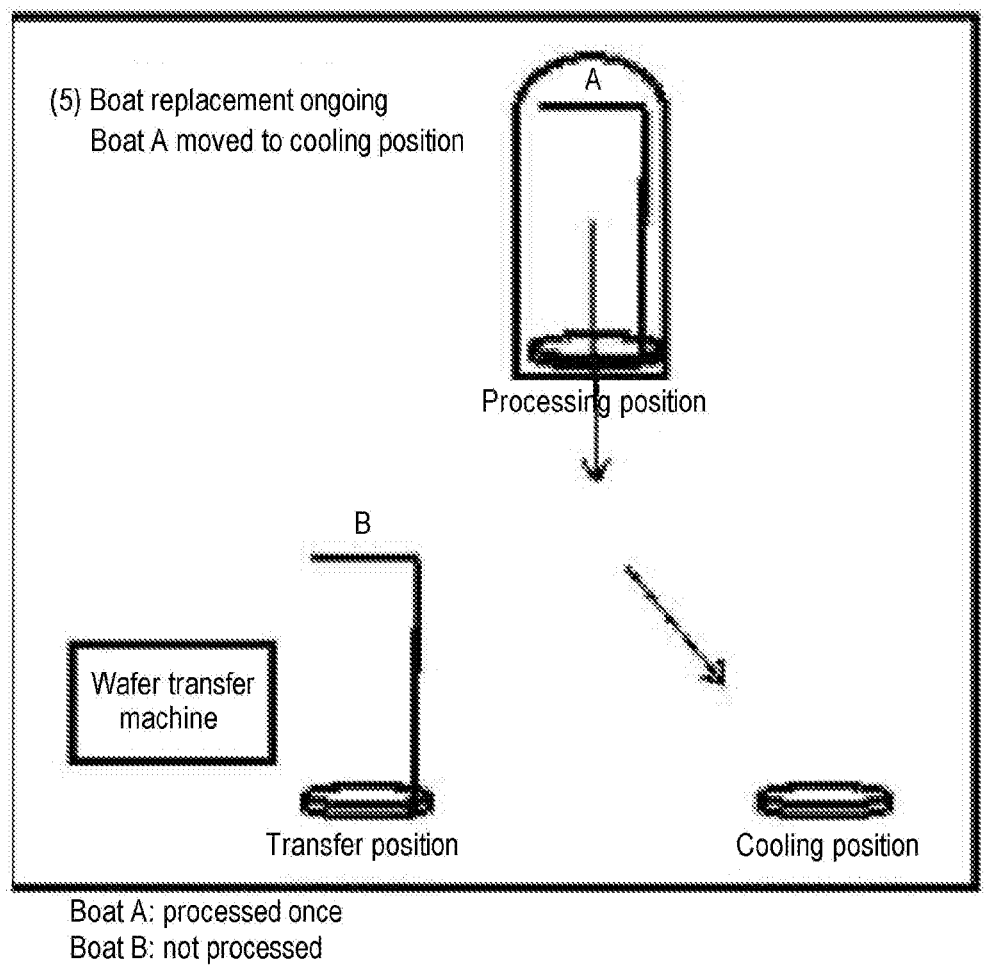
Figure 11F:
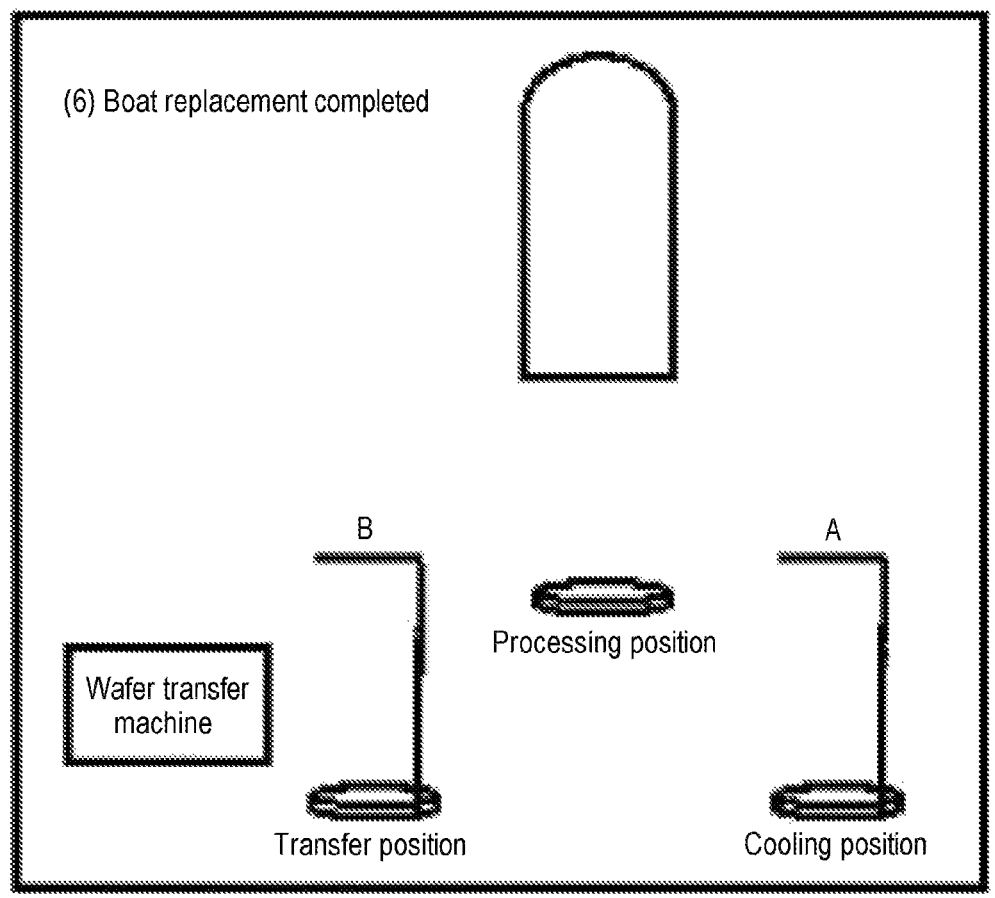
Figure 11G:
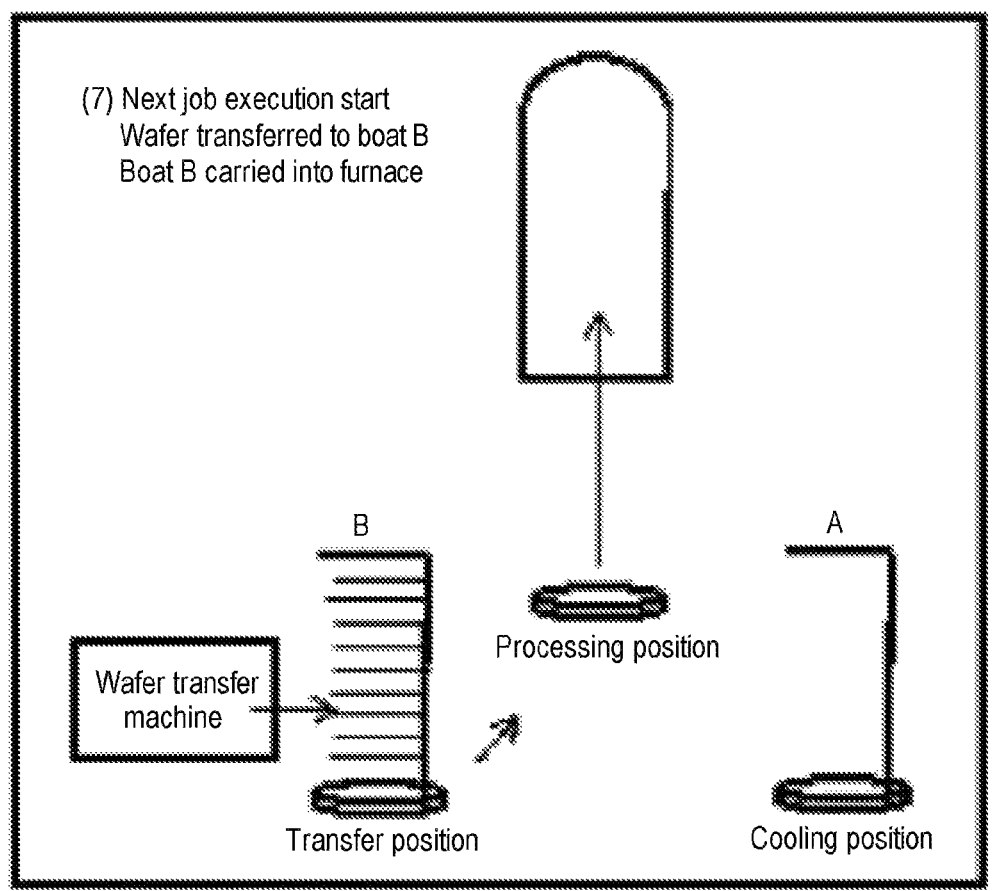
Figure 11H:
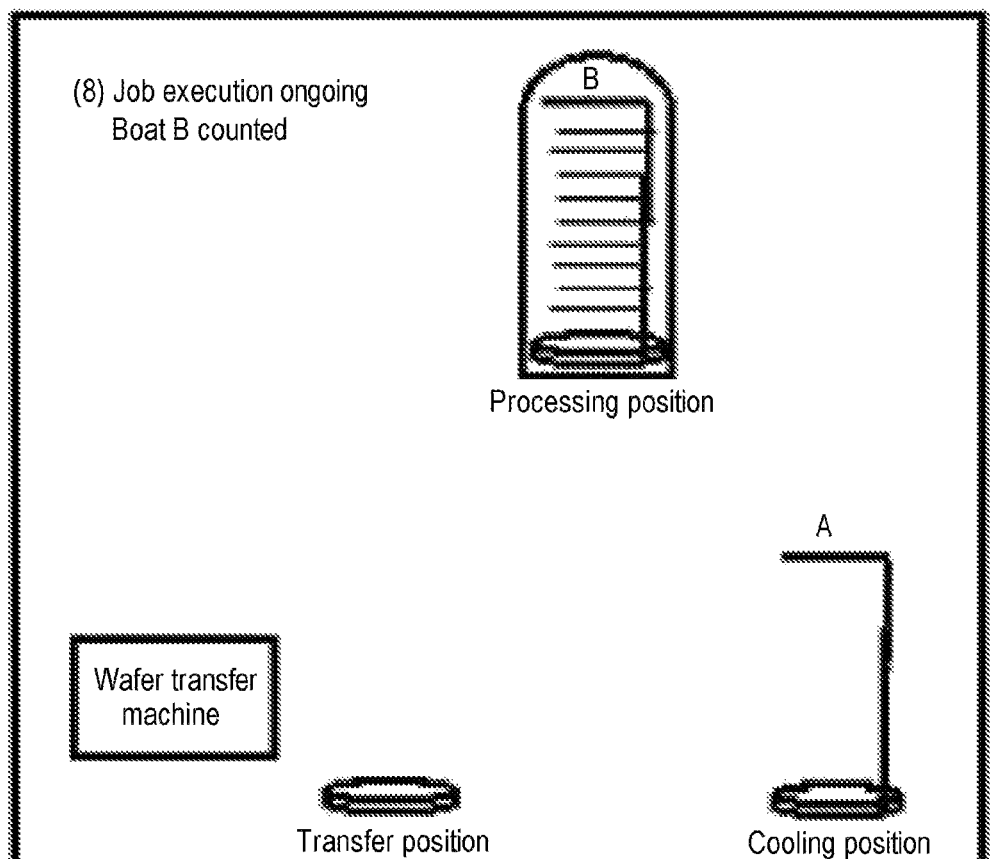

A management method of the two-boat device in the boat uniform operation mode illustrated in FIG. 9 will be described with reference to FIG. 4. The following descriptions will be focused on the management surrounded by a dot line in FIG. 9. FIG. 10 which will be described later illustrates a flowchart specific to the boat uniform operation mode.

It is assumed that in an initial sate of the boat uniform operation mode (at a job execution waiting step), the empty boats 217 not holding the wafers 200 are located in the wafer transfer position A and the boat retracting position C. The status of the device is a job execution waiting state.

First, if a job execution request is made, a boat selection step is executed. The boat use frequency of the boat 217 (boat A) located in the wafer transfer position A and the boat use frequency of the boat 217 (boat B) located in the boat retracting position C are compared with each other. The number of use times of the boat A used in the processing process and the number of use times of the boat B used in the processing process are compared with each other. For example, if the number of use times of the boat A is once and if the number of use times of the boat B is zero, the boat B may well be selected. At this time, if the boat 217 (boat B) is located in the wafer transfer position A, the flow proceeds to a substrate transfer step where the unprocessed wafers 200 are transferred from the pod 110 mounted on the pod opener mounting table 122 to the boat B.

On the other hand, if the boat 217 (boat A) is located in the wafer transfer position A, a process of replacing the boat A with the boat B is implemented. That is to say, the flow proceeds to a boat replacement step. At the boat replacement step, the boat 217 (boat A) located in the wafer transfer position A is first conveyed to the boat lowering position B. The boat A conveyed to the boat lowering position B is carried into the processing furnace 202 by the boat elevator 115. After the boat A is carried into the processing furnace 202, the boat 217 (boat B) located in the boat retracting position C is conveyed to the wafer transfer position A. If the processing of the boat A within the processing furnace 202 is completed, the boat A is moved down to the boat lowering position B and is then conveyed to the boat retracting position C by the boat replacement device 150. If the boat replacement process is completed in this way, the flow proceeds to a substrate transfer step.

At the substrate transfer step, the unprocessed wafers 200 are transferred from the pod 110 mounted on the pod opener mounting table 122 to the boat B. The boat B holding the unprocessed wafers 200 is conveyed to the boat lowering position B by the boat replacement device 150.

Then, a job is executed at a job execution step. The boat B conveyed to the boat lowering position B is carried into the processing furnace 202 by the boat elevator 115. The wafers 200 existing on the boat B are subjected to a process such as a film forming process or the like. The number of processing times of the boat B is counted and is changed from 0 to 1. After the boat B is carried into the processing furnace 202, the boat 217 (boat A) located in the boat retracting position C is conveyed to the wafer transfer position A by the boat replacement device 150. If the processing of the boat B within the processing furnace 202 is completed, the boat B is moved down to the boat lowering position B and is then conveyed to the boat retracting position C by the boat replacement device 150. Then, the boat B waits in the boat retracting position C until the processed wafers 200 held in the boat B are cooled to a predetermined temperature. After the processed wafers 200 held in the boat B are cooled to the predetermined temperature in the boat retracting position C and after the boat A is carried into the processing furnace 202, the boat B is conveyed to the wafer transfer position A by the boat replacement device 150. Then, the processed wafers 200 existing on the boat B are transferred to the pod 110 mounted on the pod opener mounting table 122.

According to the boat management of the present embodiment, even if a job execution waiting state goes on, it is possible to perform the selection of the boat prior to executing a job. This makes it possible to efficiently use both the boat A and the boat B. That is to say, the use frequencies of both boats can be made equal as far as possible. Thus, if the cumulative film thickness value of one of the boats reaches a maintenance threshold value, the cumulative film thickness value of the other boat becomes a value close to the maintenance threshold value although not reaching the maintenance threshold value. Therefore, the management of replacing both the boat A and the boat B becomes effective.

Next, descriptions will be made on FIG. 10 which illustrates a flowchart available when a boat uniform management program specific to the boat uniform operation mode is executed.

This program (boat uniform management program) is activated simultaneously with the startup of the control part 10 and waits in a job execution waiting state. If a job execution request is made, a boat selection step is executed. At the boat selection step, the use situations of the boats are compared with each other. The use situations of the boats are determined by the control part 10 by setting, for example, the cumulative film thickness value, the number of use times and the use time. The boat selection step may include a step of confirming the presence or absence of the substrates mounted to the boats.

After a target boat is designated, the confirmation of the position of the target boat is performed. That is to say, it is confirmed whether the target boat exists in the substrate transfer position (wafer transfer position A). If the designated boat exists in the wafer transfer position A, the flow proceeds to a wafer transfer step where the substrates are transferred from the pod 110 mounted on the pod opener mounting table 122 to the designated boat by the wafer transfer mechanism 125. On the other hand, if the designated boat does not exist in the wafer transfer position A, the flow proceeds to a boat replacement step.

At the boat replacement step, if the boat does not exist in the wafer transfer position A, the designated boat is directly moved to the wafer transfer position A. If a non-designated boat exists in the wafer transfer position A, the non-designated boat is moved to a predetermined retracted position and the designated boat is moved to the wafer transfer position A which remains empty. As described above, the boat replacement step is a step at which the designated boat is reliably moved to the wafer transfer position A.

Then, the flow proceeds to a wafer transfer step where, as described above, the substrates are transferred from the pod 110 mounted on the pod opener mounting table 122 to the designated boat by the wafer transfer mechanism 125. Then, the flow proceeds to a job execution step where substrate processing is executed.

By executing the present program in this way, all the boats are uniformly used without using only a specific one of the boats. Thus, the boats are efficiently used. It is therefore possible to prolong the maintenance period.

Example 5

FIGS. 11A to 11H are views illustrating one example available when the boat uniform operation mode is applied to the substrate processing apparatus according to an embodiment of the present disclosure.

It is assumed that in an initial state of the boat uniform operation mode (at a job execution waiting step), empty boats 217 not holding the wafers 200 are located in a transfer position and a cooling position. The status of the device is a job execution waiting state.

First, if a job execution request is made, a boat selection step is executed. The boat use frequency of the boat 217 (boat A) located in the transfer position and the boat use frequency of the boat 217 (boat B) located in the cooling position are compared with each other. In the present example, the numbers of times the boat A and the boat B are used in the respective processing processes are compared with each other. For example, if the number of times the boat A is used is one and if the number of times the boat B is used is zero, the boat B is selected. At this time, if the boat 217 (boat B) is located in the transfer position, the flow proceeds to a substrate transfer step where the unprocessed wafers 200 are transferred from the pod 110 mounted on the pod opener mounting table 122 to the boat 217 (boat B).

On the other hand, if the boat 217 (boat A) is located in the transfer position as in the present example illustrated in FIGS. 11A to 11H, a process of replacing the boat A with the boat B is implemented. That is to say, the flow proceeds to a boat replacement step. At the boat replacement step, the boat 217 (boat A) located in the transfer position is first conveyed to a processing position. The boat A conveyed to the processing position is carried into the processing furnace 202 by the boat elevator 115 not illustrated. After the boat A is carried into the processing furnace 202, the boat 217 (boat B) located in the cooling position is conveyed to the transfer position. Then, the boat A is moved down to the processing position and is then conveyed to the cooling position by the boat replacement device 150 not illustrated. After the boat replacement process is completed in this way, the flow proceeds to a substrate transfer step.

At the substrate transfer step, the unprocessed wafers 200 are transferred from the pod 110 mounted on the pod opener mounting table 122 to the boat 217 (boat B). Then, the boat B holding the unprocessed wafers 200 is conveyed to the processing position by the boat replacement device 150.

Then, a job is executed at a job execution step. The boat B conveyed to the processing position is carried into the processing furnace 202 by the boat elevator 115. The wafers 200 existing on the boat B are subjected to a process such as a film forming process or the like. Then, the number of processing times of the boat B is counted and is changed from 0 to 1. After the boat B is carried into the processing furnace 202, the boat 217 (boat A) located in the cooling position is conveyed to the transfer position by the boat replacement device 150. If the processing of the boat B within the processing furnace 202 is completed, the boat B is moved down to the processing position and is then conveyed to the cooling position by the boat replacement device 150. Then, the boat B waits in the cooling position until the processed wafers 200 held in the boat B are cooled to a predetermined temperature. After the processed wafers 200 held in the boat B are cooled to the predetermined temperature in the cooling position and after the boat A is carried into the processing furnace 202, the boat B is conveyed to the transfer position by the boat replacement device 150. Then, the processed wafers 200 existing on the boat B are transferred to the pod 110 mounted on the pod opener mounting table 122 by the wafer transfer machine (wafer transfer mechanism 125).

As described above, according to the boat management of the present embodiment using the boat uniform operation mode, if a job execution request is made in a job execution waiting state, the use frequencies of the boat A and the boat B are necessarily compared with each other. While the number of use times of the boat used in the processing process has been described in the present embodiment, the present disclosure is not limited thereto. Needless to say, it is possible to appropriately designate the parameter for comparing the use frequencies of the boats, such as the cumulative film thickness value, the use time or the like. Furthermore, if the boat 217 not located in the transfer position is selected at the boat selection step, the non-selected boat 217 located in the transfer position is first carried into the processing furnace 202 at the boat replacement step in order to avoid collision of the boats 217 (the boat A and the boat B). However, it goes without saying that only movement of the non-selected boat 217 to the processing position will suffice. When the reduction of a footprint is taken into account, it seems difficult to set a retracting position only for the purpose of retracting the boat 217.

As described above, the boat uniform operation mode according to the present embodiment is determined by the presence or absence of the wafers 200 on the boat 217 in the job execution confirmation process. That is to say, according to the boat management flow of the present embodiment illustrated in FIG. 9, the job continuous operation mode and the boat uniform operation mode can be selected depending on the presence or absence of the wafers 200 on the boat 217 prior to transferring the wafers 200 to the boat 217. Accordingly, it is possible to make the use frequencies of the boat A and the boat B substantially equal to each other. Thus, the management of replacing both boats 217 in the case where the cumulative film thickness value of one of the boat A and the boat B exceeds the threshold value is effective.

Furthermore, the boat uniform operation mode according to the present embodiment is configured to execute the boat selection step, the boat replacement step, the substrate transfer step and the job execution step. Thus, the boat 217 to be used in the next process is selected while confirming the use frequencies of the boat A and the boat B. If the selected boat 217 does not exist in the transfer position, the boat replacement process is implemented. Thus, the boat 217 (the boat A or the boat B) to be used is accurately selected prior to transferring the wafers 200. Accordingly, it is possible to make the use frequencies of the boat A and the boat B substantially equal to each other. Thus, the management of replacing both boats 217 in the case where cumulative film thickness value of one of the boat A and the boat B exceeds the threshold value is effective.

Figure 8A:
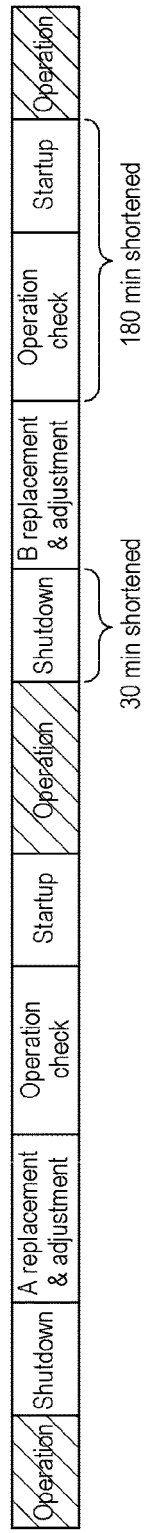
FIGS. 8A to 8D are views explaining the effects achieved in an embodiment of the present disclosure.
Figure 8B:
Figure 8C:
Figure 8D:

FIGS. 8A to 8D are views explaining the effects provided by the embodiment of the present disclosure. FIG. 8A illustrates a conventional boat replacement work and FIG. 8B illustrates the boat replacement work of the present embodiment. FIG. 8C illustrates an operating situation of a conventional processing device 100 and FIG. 8D illustrates the operating situation of the processing apparatus 100 of the present embodiment. As illustrated in FIG. 8A, in the prior art, if the replacement time of the boat A arrives, the operation of implementing substrate processing is stopped and the shutdown of the processing apparatus 100 is performed. After the shutdown of the processing apparatus 100, the replacement and adjustment of the boat A is performed and the operation check of the processing apparatus 100 is performed. After performing the operation check of the processing apparatus 100, the startup of the processing apparatus 100 is performed to re-operate the processing apparatus 100.

Then, if the replacement time of the boat B arrives, the replacement work of the boat B is performed in a similar manner as the replacement work of the boat A. After performing the shutdown of the processing apparatus 100, the replacement and adjustment of the boat B, the operation check of the processing apparatus 100 and the startup of the processing apparatus 100, the processing apparatus 100 is re-operated. In this case, about 6 hours are required until the processing apparatus 100 is re-operated after stopping the operation thereof.

However, in the present embodiment, as illustrated in FIG. 8B, if the replacement time of the boat B arrives, the replacement works of the boat A and the boat B are performed at the same time. Accordingly, it is possible to save the time required in the shutdown of the processing apparatus 100, the operation check of the processing apparatus 100 and the startup of the processing apparatus 100, which need to be performed in the replacement work of the boat B illustrated in FIG. 8A. This makes it possible shorten 210 minutes in total including the time (30 minutes) required in the shutdown of the processing apparatus 100 and the time (180 minutes) required in the operation check and startup of the processing apparatus 100.

Furthermore, as illustrated in FIG. 8C, in the prior art, the boat A and the boat B are alternately replaced between the operation state and the operation state. However, in the present embodiment, as illustrated in FIG. 8D, the boat A and the boat B are simultaneously replaced between the operation state and the operation state. Thus, the number of stop times of the processing apparatus 100 attributable to the boat replacement is reduced by half, compared with the number of stop times of the conventional processing device 100. Therefore, the production efficiency is improved.

As described above, according to the present embodiment, it is possible to obtain at least one of the following effects (1) to (9).

(1) If the cumulative film thickness value of one of two boats in use reaches the threshold value s, both boats are simultaneously replaced by new boats regardless of the cumulative film thickness value of the other boat. It is therefore possible to save the time required in the shutdown, operation check and startup of the processing device 100 involved in the boat replacement, thereby improving the throughput of the processing device.

(2) If the film forming process in which the thickness of a film deposited per one time is kept substantially equal in the boat A and the boat B is interrupted, the boat A finally subjected to the film forming process is located in the boat retracting position C. The boat B subjected to the film forming process earlier (just prior to the final film forming process), namely the boat B to which the wafers could not be mounted due to the interruption of the film forming process, is located in the wafer transfer position A. Thus, the cumulative film thickness values of the boat A and the boat B can be made substantially equal to each other. As a result, it is possible to extend the boat replacement timing.

(3) In the case where the film forming process is interrupted, it is possible to execute control so that depending on the cumulative film thickness values which are the processing histories of the boat A and the boat B, the boat A is located in the boat retracting position C while locating the boat B in the wafer transfer position A, or the boat B is located in the boat retracting position C while locating the boat A in the wafer transfer position A. It is therefore possible to bring the cumulative film thickness values of the boat A and the boat B close to each other. As a result, it is possible to extend the boat replacement timing. Specifically, the boat A having a smaller cumulative film thickness value is located in the wafer transfer position A and the boat B having a larger film thickness value is located in the boat retracting position C. It is therefore possible to bring the cumulative film thickness values of the boat A and the boat B close to each other and to extend the boat replacement timing.

(4) Even if the job execution waiting state (in which the time is vacant between batches) is generated, the operation state can be improved by simultaneously replacing both the boat A and the boat B. This is because the processing histories (the numbers of processing times, the processing time periods and the cumulative film thickness values) of the boat A and the boat B are substantially equal.

(5) Since the job continuous operation mode and the boat uniform operation mode are provided so that they can be selected, the processing histories (the numbers of processing times, the processing time periods and the cumulative film thickness values) of the boat A and the boat B can be made substantially equal regardless of the job continuous execution state and the job execution waiting state. Accordingly, the operation efficiency can be improved by simultaneously replacing both the boat A and the boat B.

(6) Even if the job execution waiting state is generated, a proper boat is selected at the time of a job execution request being made because the boat selection step and the boat replacement step are implemented prior to performing the substrate transfer. Thus, it is possible to execute control so that the boat A is located in the boat retracting position C while locating the boat B in the wafer transfer position A, or the boat B is located in the boat retracting position C while locating the boat A in the wafer transfer position A. Therefore, even if the selected boat does not exist in the wafer transfer position A, the processing histories of the boat A and the boat B can be made substantially equal. Accordingly, it is possible to efficiently use the two boats without intensively using only one boat. This makes it possible to extend the boat replacement timing.

(7) Even if the job execution waiting state (in which the time is vacant between batches) is generated, a proper boat rather than the boat located in the wafer transfer position A is selected when a job execution request is made. This is because the boat selection step and the boat replacement step are implemented prior to performing the transfer of substrates. Thus, control is executed so that the processing histories of the boat A and the boat B can be made substantially equal. As a result, it is possible to perform the management of simultaneously replacing both the boat A and the boat B.

(8) There are provided the job continuous operation mode and the boat uniform operation mode. Upon selecting the boat uniform operation mode, a proper boat rather than the boat located in the wafer transfer position A is selected by comparing the processing histories. If the selected boat does not exist in the wafer transfer position A, the transfer of substrates is started after the selected boat is moved to the wafer transfer position A. On the other hand, in the job continuous operation mode, the transfer of substrates to the boat located in the wafer transfer position A is started. Thus, the processing histories (the numbers of processing times, the processing time periods and the cumulative film thickness values) of the boat A and the boat B can be made substantially equal. Accordingly, it is possible to improve the operation efficiency by simultaneously replacing both the boat A and the boat B.

The present disclosure is not limited to the aforementioned embodiment but, needless to say, may be differently modified without departing from the spirit thereof.

In the job continuous operation mode of the aforementioned embodiment, when the film forming process is implemented in the processing furnace 202, the cumulative film thickness values as processing histories are recorded in the boat information. However, the present disclosure is not limited thereto. In the case where the cumulative film thickness value per one time is substantially constant, it may be possible to record the cumulative number of times or the cumulative time period of the processing performed in the processing furnace 202. In this case, the number of processing times or the processing time period which becomes a criterion of boat replacement is investigated in advance and is used as a threshold value for the determination of boat replacement.

While the film forming process has been described in the aforementioned embodiment, the present disclosure is not limited to the film forming process. For example, in the case of implementing an etching process, the cut depth in the etching process (the cumulative etching value) as a processing history may be recorded in the boat information. The cumulative etching value may be compared with a predetermined threshold value.

In the aforementioned embodiment, the processing apparatus is configured to implement substrate processing by alternately using two boats. However, the present disclosure is not limited thereto. The processing apparatus may be configured to implement substrate processing by sequentially using three or more boats. In this case, for example, two or more boats may be mounted on a rotatable disc-shaped boat mounting table. By rotating the boat mounting table, it is possible to sequentially load the boats, one by one, into the process chamber. If the cumulative film thickness value of one of three or more boats reaches a threshold value, all the boats may be replaced at the same time.

In the aforementioned embodiment, a process is implemented by initially inputting two boats to which films are not attached. However, the present disclosure is not limited thereto. The present disclosure may be applied to a case where a film is attached to one of the boats or a case where films are attached to both boats. Even in this case, the same boat replacement operation as that of the aforementioned embodiment is performed although the first boat replacement timing arrives soon.

In the aforementioned embodiment, the wafers are transferred from one pod to one boat. However, the wafers may be transferred from a plurality of pods to one boat. In this case, two pods which accommodate the wafers to be transferred to the same boat may be mounted on the pod opener mounting table 122.

In the job continuous operation mode of the aforementioned embodiment, if the cumulative film thickness value of the substrate holder exceeds a predetermined threshold value, it is determined that now is the replacement timing of the substrate holder. Alternatively, if the cumulative film thickness value of at least one of the substrate holders exceeds a predetermined threshold value, a cleaning recipe may be executed so that a cleaning process of removing the films deposited on the substrate holders is implemented with respect to all the substrate holders including the substrate holder whose cumulative film thickness value does not exceed the predetermined threshold value. The replacement timing of the substrate holders may be determined depending on the number of times the cleaning process is executed or the execution time period of the cleaning process.

In the aforementioned embodiment, there has been described a case where the threshold value is single. However, it may be possible to use a plurality of threshold values. For example, a first threshold value and a second threshold value may be set such that the first threshold value becomes smaller than the second threshold value. Then, if a first cumulative film thickness value cumulated in the substrates of at least one of the substrate holders exceeds the first threshold value at that time, a cleaning recipe is executed so that a cleaning process of removing the films deposited on the substrate holders is implemented with respect to all the substrate holders including the substrate holder whose cumulative film thickness value does not exceed the first threshold value. If a second cumulative film thickness value cumulated in the substrates of at least one of the substrate holders after the previous replacement of the substrate holders exceeds the second threshold value, it is determined that now is the replacement timing of the substrate holders. The operation of the substrate processing apparatus is stopped and the maintenance work is performed. However, in the case of implementing the cleaning process, it is necessary to prepare a cleaning recipe depending on the cumulative film thickness of the substrate holders. The threshold value may be not only the cumulative film thickness but also, for example, the cleaning process time or the number of times the cleaning recipe is executed. For example, the first threshold value may be set by the cumulative film thickness and the second threshold value may be set by the cleaning process time. The first threshold value and the second threshold value may be set differently.

The control part, the operation part, the display part and the storage part, which implement the processes described in the aforementioned embodiment, may not be dedicated to the substrate processing apparatus but may be realized using a general computer system such as, for example, a personal computer or the like. For example, the control part, the operation part, the display part and the storage part may be configured by installing the program for the execution of the aforementioned processes into a general-purpose computer from a storage medium (a flexible disk, a CD-ROM, a USB memory, etc.) which stores the program.

Furthermore, the means for supplying the program for the execution of the aforementioned processes may be arbitrarily selected. In addition to being supplied through a specific storage medium as described above, the program may be supplied through, for example, a communication line, a communication network or a communication system. In this case, the program may be posted to, for example, a bulletin board of a communication network and may be supplied through a network. Then, the program supplied in this way is started up and is executed just like other application programs under the control of an OS (Operating system) of the substrate processing apparatus. It is therefore possible to implement the processes described above.

The present disclosure may be applied to not only a semiconductor manufacturing device but also a glass substrate processing apparatus such as an LCD manufacturing device or the like and other substrate processing apparatus. The contents of the substrate processing may include not only CVD, PVD and a film forming process forming an epitaxial growth film, an oxide film, a nitride film, a metal-containing film or the like, but also an oxidizing process, a diffusing process, an etching process, an exposure process, lithography, a coating process or the like. In addition, the present disclosure may be applied to a device other than the vertical film forming device. For example, the present disclosure may be applied to a horizontal device which makes use of boats, or a single-substrate-type or multiple-substrate-type substrate processing apparatus which replaces a susceptor as a substrate holder according to a processing history.

In addition to the aforementioned embodiment, some preferred aspects of the present disclosure will be described below as supplementary notes.

(Supplementary Note 1)

According to one aspect of the present disclosure, there is provided a maintenance method of a substrate processing apparatus, including: a first carry-in step of carrying a first substrate holder holding a substrate into a process chamber; a first processing step of, after the first carry-in step, processing the substrate held by the first substrate holder within the process chamber; a first carry-out step of, after the first processing step, carrying the first substrate holder holding the substrate out of the process chamber; a second carry-in step of carrying a second substrate holder holding a substrate into the process chamber; a second processing step of, after the second carry-in step, processing the substrate held by the second substrate holder within the process chamber; a second carry-out step of, after the second processing step, carrying the second substrate holder holding the substrate out of the process chamber; a determination step of determining a replacement timing of the first substrate holder and the second substrate holder; and a maintenance step of, at the replacement timing determined at the determination step, replacing the first substrate holder and the second substrate holder respectively with a third substrate holder and a fourth substrate holder, if at least one of the first substrate holder and the second substrate holder reaches the replacement timing.

(Supplementary Note 2)

According to another aspect of the present disclosure, there is provided a method for manufacturing a semiconductor device, including: a first carry-in step of carrying a first substrate holder holding a substrate into a process chamber; a first processing step of, after the first carry-in step, processing the substrate held by the first substrate holder within the process chamber in order to form a semiconductor device on a surface of the substrate; a first carry-out step of, after the first processing step, carrying the first substrate holder holding the substrate out of the process chamber; a second carry-in step of carrying a second substrate holder holding a substrate into the process chamber; a second processing step of, after the second carry-in step, processing the substrate held by the second substrate holder within the process chamber in order to form a semiconductor device on a surface of the substrate; a second carry-out step of, after the second processing step, carrying the second substrate holder holding the substrate out of the process chamber; a determination step of determining a replacement timing of the first substrate holder and the second substrate holder; and a maintenance step of, at the replacement timing determined at the determination step, replacing the first substrate holder and the second substrate holder respectively with a third substrate holder and a fourth substrate holder, if at least one of the first substrate holder and the second substrate holder reaches the replacement timing.
(Supplementary Note 3)

According to another aspect of the present disclosure, there is provided a substrate processing apparatus, including: a process chamber configured to process a substrate; a first substrate holder carried into the process chamber while holding a substrate; a second substrate holder carried into the process chamber while holding a substrate; a substrate container configured to accommodate the substrate, and a control part configured to determine a replacement timing of the first substrate holder and the second substrate holder and configured to, at the replacement timing thus determined, execute control so as to bring the first substrate holder and the second substrate holder into an empty state in which the first substrate holder and the second substrate holder do not hold a substrate, if at least one of the first substrate holder and the second substrate holder reaches the replacement timing.
(Supplementary Note 4)

According to another aspect of the present disclosure, there is provided a maintenance program of a substrate processing apparatus or a storage medium for readably storing the maintenance program, wherein the maintenance program causes a computer to execute: a first carry-in procedure of carrying a first substrate holder holding a substrate into a process chamber; a first processing procedure of processing the substrate held by the first substrate holder within the process chamber; a first carry-out procedure of carrying the first substrate holder holding the substrate out of the process chamber; a second carry-in procedure of carrying a second substrate holder holding a substrate into the process chamber; a second processing procedure of processing the substrate held by the second substrate holder within the process chamber; a second carry-out procedure of carrying the second substrate holder holding the substrate out of the process chamber; a determination procedure of determining a replacement timing of the first substrate holder and the second substrate holder; and a procedure of, at the replacement timing, bringing the first substrate holder and the second substrate holder into an empty state in which the first substrate holder and the second substrate holder do not hold a substrate, if at least one of the first substrate holder and the second substrate holder reaches the replacement timing.
(Supplementary Note 5)

Preferably, there is provided the method of Supplementary Note 2, wherein a process implemented at the first processing step and the second processing step is a film forming process of forming a film on the surface of the substrate, and at the determination step, a timing at which the thickness of a film formed in the first substrate holder reaches a predetermined threshold value is determined to be the replacement timing.
(Supplementary Note 6)

Preferably, there is provided the method of Supplementary Note 2 or 5, further including: a shutdown step of, before the maintenance step, implementing a shutdown process including a process of reducing a temperature of the process chamber; and a startup step of, after the maintenance step, implementing a startup process including a process of increasing the temperature of the process chamber.
(Supplementary Note 7)

Preferably, there is provided the method of Supplementary Note 2, 5 or 6, further including: a first mounting step of, before the first carry-in step, mounting the substrate to the first substrate holder in a substrate transfer position; a first removal step of, after the first carry-out step, removing the substrate from the first substrate holder in the substrate transfer position; a second mounting step of, before the second carry-in step, mounting the substrate to the second substrate holder in the substrate transfer position; a second removal step of, after the second carry-out step, removing the substrate from the second substrate holder in the substrate transfer position; and a substrate holder selection step of, if a processing interruption state in which the first mounting step cannot be implemented due to the absence of the substrate to be mounted to the first substrate holder at the first mounting step is generated after the first removal step, selecting the substrate holder to be initially carried into the process chamber after elimination of the processing interruption state, depending on processing histories of the first substrate holder and the second substrate holder.
(Supplementary Note 8)

Preferably, there is provided the method of Supplementary Note 2, 5 or 6, further including: a first mounting step of, before the first carry-in step, mounting the substrate to the first substrate holder in a substrate transfer position; a first removal step of, after the first carry-out step, removing the substrate from the first substrate holder in the substrate transfer position; a second mounting step of, before the second carry-in step, mounting the substrate to the second substrate holder in the substrate transfer position; a second removal step of, after the second carry-out step, removing the substrate from the second substrate holder in the substrate transfer position; and a substrate holder selection step of, if a processing interruption state in which the first mounting step cannot be implemented due to the absence of the substrate to be mounted to the first substrate holder at the first mounting step is generated after the first removal step, selecting the first substrate holder as a substrate holder to be initially carried into the process chamber after elimination of the processing interruption state.
(Supplementary Note 9)

Preferably, there is provided the method of Supplementary Note 8, further including: a substrate holder disposing step of, if the processing interruption state is generated, implementing the second removal step by conveying the second substrate holder to the substrate transfer position after the second processing step is completed, then disposing the second substrate holder in a retracting position differing from the substrate transfer position, and disposing the first substrate holder of an empty state in the substrate transfer position.
(Supplementary Note 10)

Preferably, there is provided the method of Supplementary Note 1, further including: a step of comparing a cumulative film thickness value accumulated in the substrate with a predetermined threshold value after carrying the substrate held by the substrate holder into the process chamber to process the substrate; a determination step of determining that now is a replacement timing of the substrate holders, if the cumulative film thickness value exceeds the predetermined threshold value; and a maintenance step of performing replacement of the substrate holders at the replacement timing.

(Supplementary Note 11)

Preferably, there is provided the method of Supplementary Note 10, further including: a shutdown step of, before the maintenance step, performing shutdown of the substrate processing apparatus, wherein the shutdown step includes a temperature reducing process of cooling an interior of the process chamber and the substrate holders to a predetermined temperature and an air substitution process of filling the interior of the process chamber with an air.

(Supplementary Note 12)

Preferably, there is provided the method of Supplementary Note 10, wherein a process of adjusting positions of the replaced substrate holders, a process of adjusting a position of a substrate transfer mechanism which transfers the substrate to the substrate holders, a process of checking an operation of the substrate processing apparatus and a temperature increasing process of heating an interior of the process chamber to a predetermined temperature are implemented after the maintenance step.

(Supplementary Note 13)

Preferably, there is provided the method of Supplementary Note 12, wherein the startup step includes a process of storing job information in a job information storage part and a process of storing substrate holder information in a boat information storage part.

(Supplementary Note 14)

According to another aspect of the present disclosure, there is provided a maintenance method of a substrate processing apparatus, including: a first comparison step of carrying a substrate held by a substrate holder into a process chamber, processing the substrate and then comparing a cumulative film thickness value accumulated in the substrate with a predetermined threshold value; a cleaning step of cleaning an interior of the process chamber if the cumulative film thickness value exceeds the predetermined threshold value; a determination step of determining a replacement timing of the substrate holder depending on the number of times the cleaning step is executed or an execution time period of the cleaning step; and a maintenance step of performing replacement of the substrate holder at the replacement timing.

(Supplementary Note 15)

According to another aspect of the present disclosure, there is provided a maintenance method of a substrate processing apparatus, including: a first comparison step of carrying a substrate held by a substrate holder into a process chamber, processing the substrate and then comparing a first cumulative film thickness value accumulated in the substrate at that time with a first threshold value; a cleaning step of cleaning an interior of the process chamber if the first cumulative film thickness value exceeds the first threshold value; a second comparison step of comparing a second cumulative film thickness value accumulated in the substrate after previous replacement of the substrate holder with a second threshold value; a determination step of determining that now is a replacement timing of the substrate holder, if the second cumulative film thickness value exceeds the second threshold value at the second comparison step; and a maintenance step of performing replacement of the substrate holder at the replacement timing.

(Supplementary Note 16)

Preferably, there is provided the method of Supplementary Note 15, wherein the second threshold value is the number of times the cleaning step is executed or an execution time period of the cleaning step.

(Supplementary Note 17)

According to another aspect of the present disclosure, there is provided a management program of a substrate processing apparatus or a storage medium for readably storing the management program, wherein the management program includes a procedure of selecting one of a job continuous operation mode and a boat uniform operation mode; a boat designation procedure of designating a first substrate holder to which a substrate is transferred; a boat replacement procedure of replacing the designated first substrate holder with a second substrate holder located in a predetermined position so that the designated first substrate holder is disposed in the predetermined position; a procedure of transferring the substrate to the first substrate holder after the designated first substrate holder is disposed in the predetermined position; and a procedure of implementing a predetermined process with respect to the substrate held by the first substrate holder.

(Supplementary Note 18)

According to another aspect of the present disclosure, there is provided a method for managing a substrate processing apparatus, including: a step of selecting one of a job continuous operation mode and a boat uniform operation mode; a step of designating a first substrate holder to which a substrate is transferred; a boat replacement step of replacing the designated first substrate holder with a second substrate holder located in a predetermined position so that the designated first substrate holder is disposed in the predetermined position; and a step of transferring the substrate to the first substrate holder after the designated first substrate holder is disposed in the predetermined position.

(Supplementary Note 19)

According to another aspect of the present disclosure, there is provided a method for manufacturing a semiconductor device, including: a step of selecting one of a job continuous operation mode and a boat uniform operation mode; a step of designating a first substrate holder to which a substrate is transferred; a boat replacement step of replacing the designated first substrate holder with a second substrate holder located in a predetermined position so that the designated first substrate holder is disposed in the predetermined position; a step of transferring the substrate to the first substrate holder after the designated first substrate holder is disposed in the predetermined position; and a substrate processing step of processing the substrate.

(Supplementary Note 20)

According to another aspect of the present disclosure, there is provided a management program of a substrate processing apparatus or a storage medium for readably storing the management program, wherein the management program causes a computer to execute: a procedure of selecting one of a job continuous operation mode and a boat uniform operation mode; a boat designation procedure of, if the boat uniform operation mode is selected, designating a first substrate holder to which a substrate is transferred; a boat replacement procedure of replacing the designated first substrate holder with a second substrate holder located in a predetermined position so that the designated first substrate holder is disposed in the predetermined position; and a procedure of transferring the substrate to the first substrate holder after the designated first substrate holder is disposed in the predetermined position, wherein if the job continuous operation mode is selected, the management program causes the computer to execute at least a procedure of transferring the substrate to at least one of the first substrate holder and the second substrate holder, whichever is disposed in the predetermined position.

(Supplementary Note 21)

According to another aspect of the present disclosure, there is provided a substrate processing apparatus, including: a process chamber configured to process a substrate; a first substrate holder carried into the process chamber while holding a substrate; a second substrate holder carried into the process chamber while holding a substrate; a transfer part configured to transfer the substrate to the first substrate holder or the second substrate holder; a conveying part configured to convey the first substrate holder and the second substrate holder; a determination part configured to determine a replacement timing of the first substrate holder and the second substrate holder; and a control part configured to, at the replacement timing determined by the determination part, control the transfer part and the conveying part so as to bring the first substrate holder and the second substrate holder into an empty state in which the first substrate holder and the second substrate holder do not hold a substrate, if at least one of the first substrate holder and the second substrate holder reaches the replacement timing.

This application claims the benefit of Japanese Patent Application No. 2013-175784, filed on Aug. 27, 2013, in the Japan Patent Office, the disclosure of which is incorporated herein in its entirety by reference.

INDUSTRIAL USE OF THE PRESENT INVENTION

The present disclosure can be applied to a substrate processing apparatus which includes a plurality of substrate holders and which processes substrates held by the substrate holders.

EXPLANATION OF REFERENCE NUMERALS

10: control part, 11: main control part, 12: temperature control part, 13: gas flow rate control part, 14: pressure control part, 15: conveying control part, 20: storage part, 21: job information storage part, 22: boat information storage part, 23: recipe storage part, 24: threshold value storage part, 31: operation part, 32: display part, 100: substrate processing apparatus, 105: rotary rack, 110: pod (substrate container), 111: housing, 111a: front wall, 112: pod carry-in/carry-out port, 113: front shutter, 114: load port, 115: boat elevator, 116: post, 117: rack plate, 118: pod conveying device, 119: sub housing, 120: wafer carry-in/carry-out port, 121: pod opener, 122: mounting table, 123: cap attaching/detaching mechanism, 124: transfer chamber, 125: wafer transfer mechanism, 128: arm, 133: clean air, 134: clean unit, 142: wafer carry-in/carry-out opening, 147: furnace opening gate valve, 150: boat replacement device, 151a, 151c: boat support arm, 152: arm post, 153a, 153c: boat stand, 200: wafer (substrate), 202: processing furnace, 217: boat (substrate holder), 217a: boat post, 219: seal cap, A: wafer transfer position, B: boat lowering position, C: boat retracting position

What is claimed is:

1. A maintenance method of a substrate processing device, comprising:
    a first processing step of carrying a first substrate holder holding a substrate into a process chamber and processing the substrate held by the first substrate holder within the process chamber;
    a second processing step of carrying a second substrate holder holding a substrate into the process chamber and processing the substrate held by the second substrate holder within the process chamber;
    a determination step of determining a replacement timing of the first substrate holder and the second substrate holder;
    a shutdown step including a temperature reducing process of cooling the process chamber, the first substrate holder and the second substrate holder to a predetermined temperature;
    a maintenance step of replacing the first substrate holder and the second substrate holder respectively with a third substrate holder and a fourth substrate holder;
    a startup step of performing a startup process including a temperature increasing process of heating the process chamber,
    wherein if at least one of the first substrate holder and the second substrate holder reaches the replacement timing, the shutdown step, the maintenance step, and the startup step are performed at the replacement timing that is determined in the determination step;
    a first mounting step of mounting the substrate to the first substrate holder in at least a substrate transfer position;
    a first removal step of removing the substrate from the first substrate holder in the substrate transfer position; and
    a substrate holder selection step of, if a processing interruption state in which the first mounting step cannot be implemented due to an absence of the substrate to be mounted to the first substrate holder at the first mounting step is generated after the first removal step, selecting the substrate holder to be initially carried into the process chamber after elimination of the processing interruption state, depending on a processing history of each of the first substrate holder and the second substrate holder.

2. The method of claim 1, further comprising:
    a comparison step of comparing a cumulative film thickness value accumulated in the substrate with a predetermined threshold value,
    wherein if the cumulative film thickness value in at least one of the first substrate holder and the second substrate holder exceeds the predetermined threshold value at the comparison step, it is determined at the determination step that now is the replacement timing of the substrate holders.

3. The method of claim 1, wherein the shutdown step is performed before the maintenance step, and further includes an air substitution process of filling the interior of the process chamber with an air.

4. The method of claim 1, wherein at least one of a process of adjusting positions of the replaced substrate holders, a process of adjusting a position of a substrate transfer mechanism which transfers the substrate to the substrate holders, a process of checking an operation of the substrate processing device and the temperature increasing process is implemented after the maintenance step.

5. The method of claim 1, wherein the startup step is performed after the maintenance step, and further includes a process of storing job information in a job information storage part and a process of storing substrate holder information in a boat information storage part.

6. The method of claim 1, further comprising:
    a second mounting step of, before the second processing step, mounting the substrate to the second substrate holder in the substrate transfer position;
    a second removal step of, after a second carry-out step of carrying the second substrate holder out of the process chamber, removing the substrate from the second substrate holder in the substrate transfer position; and a substrate holder disposing step of, if the processing interruption state is generated, implementing the second removal step by conveying the second substrate holder to the substrate transfer position after the second processing step is completed, then disposing the second substrate holder in a retracting position differing from the substrate transfer position, and disposing the first substrate holder of an empty state in the substrate transfer position.

7. A method for manufacturing a semiconductor device, comprising:
   a first processing step of carrying a first substrate holder holding a substrate into a process chamber and processing the substrate held by the first substrate holder within the process chamber;
   a second processing step of carrying a second substrate holder holding a substrate into the process chamber and processing the substrate held by the second substrate holder within the process chamber;
   a determination step of determining a replacement timing of the first substrate holder and the second substrate holder;
   a shutdown step including a temperature reducing process of cooling the process chamber, the first substrate holder and the second substrate holder to a predetermined temperature;
   a maintenance step of replacing the first substrate holder and the second substrate holder respectively with a third substrate holder and a fourth substrate holder;
   a startup step of performing a startup process including a temperature increasing process of heating the process chamber,
   wherein if at least one of the first substrate holder and the second substrate holder reaches the replacement timing, the shutdown step, the maintenance step, and the startup step are performed at the replacement timing that is determined in the determination step;
   a first mounting step of mounting the substrate to the first substrate holder in at least a substrate transfer position;
   a first removal step of removing the substrate from the first substrate holder in the substrate transfer position; and
   a substrate holder selection step of, if a processing interruption state in which the first mounting step cannot be implemented due to an absence of the substrate to be mounted to the first substrate holder at the first mounting step is generated after the first removal step, selecting the substrate holder to be initially carried into the process chamber after elimination of the processing interruption state, depending on a processing history of each of the first substrate holder and the second substrate holder.

8. The method of claim 7, wherein a process implemented at the first processing step and the second processing step is a film forming process of forming a film on a surface of the substrate, and at the determination step, a timing at which a thickness of the film formed in at least one of the first substrate holder and the second substrate holder reaches a predetermined threshold value is determined to be the replacement timing.

9. The method of claim 7,
   wherein the shutdown step is performed before the maintenance step, and the startup step is performed after the maintenance step.

10. A non-transitory computer-readable recording medium for readably storing a maintenance program of a substrate processing device which causes a computer to execute:
   a first processing procedure of carrying a first substrate holder holding a substrate into a process chamber and processing the substrate held by the first substrate holder within the process chamber;
   a second processing procedure of carrying a second substrate holder holding a substrate into the process chamber and processing the substrate held by the second substrate holder within the process chamber;
   a determination procedure of determining a replacement timing of the first substrate holder and the second substrate holder;
   a shutdown procedure including a temperature reducing process of cooling the process chamber, the first substrate holder and the second substrate holder to a predetermined temperature;
   a maintenance procedure of bring the first substrate holder and the second substrate holder into an empty state in which the first substrate holder and the second substrate holder do not hold a substrate;
   a startup procedure of performing a startup process including a temperature increasing process of heating the process chamber,
   wherein if at least one of the first substrate holder and the second substrate holder reaches the replacement timing, the shutdown procedure, the maintenance procedure, and the startup procedure are performed at the replacement timing that is determined in the determination procedure;
   a first mounting step of mounting the substrate to the first substrate holder in at least a substrate transfer position;
   a first removal step of removing the substrate from the first substrate holder in the substrate transfer position; and
   a substrate holder selection step of, if a processing interruption state in which the first mounting step cannot be implemented due to an absence of the substrate to be mounted to the first substrate holder at the first mounting step is generated after the first removal step, selecting the substrate holder to be initially carried into the process chamber after elimination of the processing interruption state, depending on a processing history of each of the first substrate holder and the second substrate holder.

* * * * *